US012720682B2

(12) United States Patent
Gangadharan et al.

(10) Patent No.: US 12,720,682 B2
(45) Date of Patent: Aug. 25, 2026

(54) EFFICIENT ASSEMBLY FOR ELECTROLYTIC CAPACITORS ON SOLID STATE DRIVES

(71) Applicant: Sandisk Technologies, Inc., Milpitas, CA (US)

(72) Inventors: Dibin Gangadharan, Bangalore (IN); Nidhin Joe Kuttikkat, Bangalore (IN)

(73) Assignee: Sandisk Technologies, Inc., Milpitas, CA (US)

(*) Notice: Subject to any disclaimer, the term of this patent is extended or adjusted under 35 U.S.C. 154(b) by 346 days.

(21) Appl. No.: 18/534,409

(22) Filed: Dec. 8, 2023

(65) Prior Publication Data

US 2025/0194016 A1 Jun. 12, 2025

(51) Int. Cl.
*H05K 1/182* (2026.01)
*H01G 9/00* (2006.01)
(Continued)

(52) U.S. Cl.
CPC .......... *H05K 1/182* (2013.01); *H01G 9/0029* (2013.01); *H01G 9/08* (2013.01); *H05K 1/183* (2013.01);
(Continued)

(58) Field of Classification Search
CPC .... H05K 1/14; H05K 1/144–147; H05K 1/18; H05K 1/181–185; H05K 2201/09036; H05K 2201/09063; H05K 2201/10015; H05K 2201/10159; H05K 2201/10651; H05K 3/0011; H05K 3/34; H05K 3/40; H01L 23/498; H01L 23/552
(Continued)

(56) References Cited

U.S. PATENT DOCUMENTS 4,763,227 A * 8/1988 Novacek ................ H05K 3/308 361/538
6,552,912 B1 * 4/2003 Kanazawa ............ H02M 7/003 361/752
(Continued)

FOREIGN PATENT DOCUMENTS

WO WO2013/185584 A1 12/2013

OTHER PUBLICATIONS

Notice of Allowance dated Apr. 9, 2025, U.S. Appl. No. 18/346,327, filed Jul. 3, 2023.
English Abstract of PCT Publication No. WO2013/185584 published Dec. 19, 2013.
U.S. Appl. No. 18/346,327, filed Jul. 3, 2023.

*Primary Examiner* — Tuan T Dinh
(74) *Attorney, Agent, or Firm* — Pearl Cohen Zedek Latzer Baratz LLP

(57) ABSTRACT

To allow attachment of electrolytic capacitors and other relatively large electrical circuit devices to a PCB while meeting size limitations, The PCB can include a full-through opening within which the device can be located. Along one edge of the opening, the PCB includes half-through cuts with a conductive lining extending from the opening, where the pins of the capacitor or other device can rest and form electrical connections. In addition to pins extending radially from one end of the capacitor or other device, the device includes a notch extending from the opposing end. Along the edge of the PCB opening opposing the half-through cuts for the pins, the PCB includes a half-though cut for the device's notch to rest, thereby providing mounting stability.

14 Claims, 28 Drawing Sheets

(51) Int. Cl.

| | |
|---|---|
| ***H01G 9/08*** | (2006.01) |
| ***H05K 1/183*** | (2026.01) |
| ***H05K 3/00*** | (2006.01) |
| ***H05K 3/34*** | (2006.01) |
| ***H05K 3/40*** | (2006.01) |
| ***H10B 80/00*** | (2023.01) |
| *H10W 72/50* | (2026.01) |
| *H10W 90/00* | (2026.01) |

(52) U.S. Cl.

CPC ............. *H05K 3/0011* (2013.01); *H05K 3/34* (2013.01); *H05K 3/40* (2013.01); *H10B 80/00* (2023.02); *H05K 2201/09036* (2013.01); *H05K 2201/09063* (2013.01); *H05K 2201/10015* (2013.01); *H05K 2201/10159* (2013.01); *H05K 2201/10651* (2013.01); *H10W 72/5445* (2026.01); *H10W 90/00* (2026.01); *H10W 90/752* (2026.01); *H10W 90/754* (2026.01)

(58) Field of Classification Search

USPC ....... 361/735–737, 760, 764, 784, 790, 795; 257/678–683

See application file for complete search history.

(56) References Cited

U.S. PATENT DOCUMENTS

| | | | | |
|---|---|---|---|---|
| 6,573,567 | B1 * | 6/2003 | Nishizawa | G06K 19/07735 257/E23.176 |
| 7,123,465 | B2 | 10/2006 | Crane, Jr. et al. | |
| 7,161,239 | B2 | 1/2007 | Zhao et al. | |
| 7,791,887 | B2 * | 9/2010 | Ganev | H05K 7/209 361/274.3 |
| 8,271,925 | B2 | 9/2012 | Kobayashi | |
| 8,451,617 | B2 * | 5/2013 | Chan | H05K 1/18 361/766 |
| 2007/0158799 | A1 | 7/2007 | Chiu | |
| 2009/0078998 | A1 | 3/2009 | Shi | |
| 2013/0286612 | A1 * | 10/2013 | Iwasaki | H05K 3/301 29/832 |
| 2018/0242469 | A1 * | 8/2018 | Suzuki | H05K 7/20472 |
| 2018/0270943 | A1 * | 9/2018 | Suzuki | H05K 1/0203 |
| 2019/0006101 | A1 * | 1/2019 | Matsumae | H01G 9/08 |
| 2021/0015006 | A1 * | 1/2021 | Muto | H05K 5/13 |
| 2021/0345489 | A1 * | 11/2021 | Ryu | H01G 9/06 |
| 2023/0284390 | A1 * | 9/2023 | Nagasawa | H05K 1/182 361/761 |

* cited by examiner 307
307
300
301
300
311

Cross-cut A-A 509 507 511 507 509
500' 500'
510 510
500 500
501

EFFICIENT ASSEMBLY FOR ELECTROLYTIC CAPACITORS ON SOLID STATE DRIVES

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and SSDs (Solid State Drives).

Memory devices are packaged in standard sizes, including for example an SD (Secure Digital) card, where semiconductor dies are mounted on a substrate and then encapsulated in a protective mold compound. For SD cards and other memory devices, as well as for the packaging of other integrated circuit devices, an integrated circuits are mounted a printed circuit board (PCB) that will typically also have a number of passive devices such as capacitors, resistors and/or inductors connected to the PCB. Given the ever-present drive toward higher storage capacities in a standard sized memory card, there is a need to find additional space in a memory card to use for increasing storage capacity. One way to find such additional space is to reduce the area on the PCB given over to passive devices such as capacitors.

Another concern is the cost and time of manufacture of the PCB and the attaching of components, both integrated circuits and passive components, to the PCB. The attachment of passive elements such as capacitors can interrupt the manufacturing flow for the PCB and the mounting of integrated circuits. Consequently, the manufacturing process could benefit from improved incorporation for the mounting of passive devices on the PCB.

A further concern with incorporating capacitors or other relatively large surface mount devices is being able to fit them with the form factor requirements of the packaging. For example, the PCBs of solid state drives (SSDs) will typically have a number of integrated circuits attached to their surface, such as non-volatile memory chips and memory controllers. They will also often have need of a large capacitance attached to the PCB. As all of these elements need to fit into a specified packing size, this can greatly limit the possible size of surface mount devices, so that rather than use less expensive, but larger, electrolytic capacitors, smaller, but more expensive, capacitors (e.g., tantalum capacitors) would be required to meet the capacitance requirements and space limitations. Consequently, there would be advantages to be able to use larger surface mount devices for a PCB while still meeting size restrictions.

DESCRIPTION OF THE DRAWINGS

FIG. 19 replicates the features of FIG. 18, but supported by an SMD pallet as during processing for the attachment of the capacitor.

DETAILED DESCRIPTION

The present technology will now be described with reference to the figures, which in embodiments, relate to placement of capacitors and similar devices on a printed circuit board (PCB) of a semiconductor device, such as a solid state drive (SSD). More specifically, to allow attachment of electrolytic capacitors and other relatively large electrical circuit devices to a PCB while meeting size limitations, the PCB can include a full-through opening within which the device can be located. Along one edge of the opening, the PCB includes half-through cuts with a conductive lining extending from the opening, where pins of the capacitor or other device can rest and form electrical connections. In addition to pins extending radially from one end of the capacitor or other device, the device includes a notch extending from the end opposing the pins. Along the edge of the PCB opening opposing the half-through cuts for the pins, the PCB includes a half-though cut for the capacitor's or other device's notch to rest, thereby providing mounting stability.

It is understood that the present subject matter may be embodied in many different forms and should not be construed as being limited to the embodiments set forth herein. Rather, these embodiments are provided so that this disclosure will be thorough and complete and will fully convey the subject matter to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Figure 1:
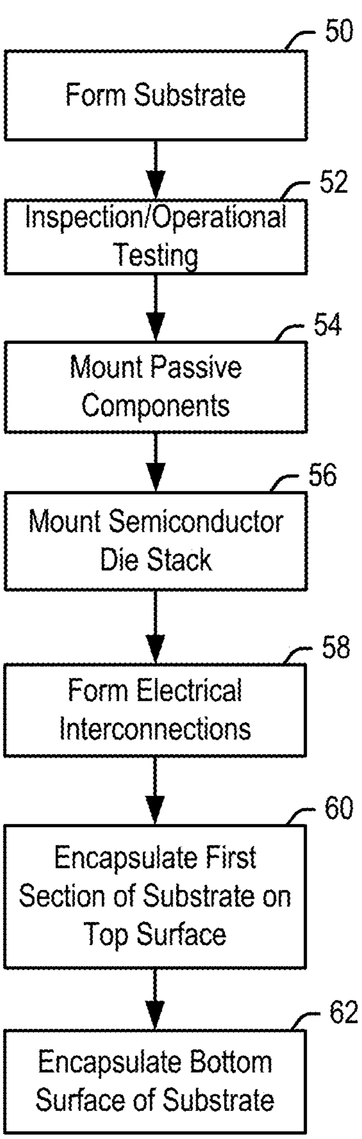
FIG. 1 is a flowchart of the overall fabrication process of a substrate and a semiconductor device using that substrate according to embodiments of the present technology.

FIG. 1 is flowchart for the manufacture and assembly of a substrate and a semiconductor device that be used for the embodiments presented below. FIGS. 2-7 present edge and top views at different stages of the process. The shown embodiment in FIGS. 2-7 is for a single semiconductor device 150 including a differential height substrate 100, or portions thereof, but it is understood that the semiconductor device of the present technology may be assembled from a panel of differential height substrates to achieve economies of scale. Although such substrates are most commonly of a single height, they can also have two (as shown) or more differential heights.

Figure 2:
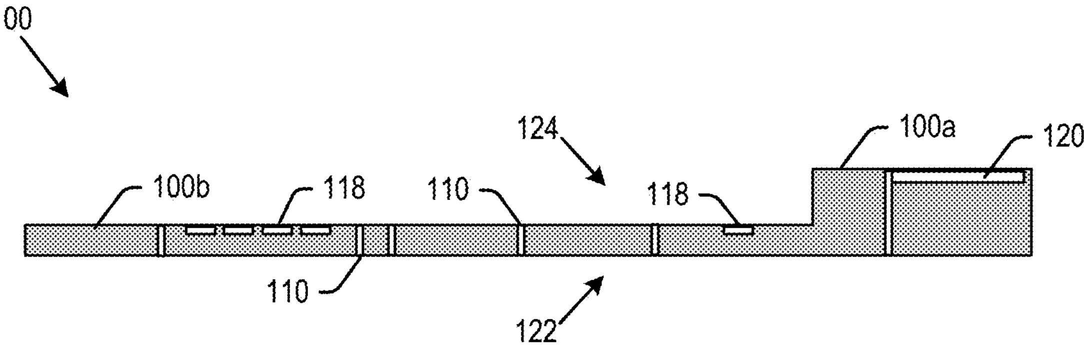
FIG. 2 is a generalized edge view of an embodiment for a substrate of a semiconductor device according to an embodiment of the present technology.

In step 50, a substrate such as substrate 100 illustrated in FIG. 2 is formed. The example differential height substrate 100 is a signal-carrier medium provided for transferring electrical signals between semiconductor dies mounted on the substrate and a host device, as explained below. In one embodiment of the present technology, the substrate 100 may be a printed circuit board (PCB), but the substrate 100 may be formed of other signal-carrier mediums such as flex tapes, interposers or combinations thereof. Although more generally applicable, the main embodiments presented in the following will be for PCBs.

Referring now to the edge view of FIG. 2, the substrate 100 includes a first section 100*a* of a greater thickness and a second, thinner section. The substrate 100 formed in step 50 can include a signal carrier assembly comprised of conductive layers sandwiching a dielectric core. The conductive layers may be formed of copper or copper alloys, plated copper or plated copper alloys, Alloy 42 (42Fe/58Ni), copper plated steel, or other metals and materials suitable for use on substrate panels. The core may be formed of various dielectric materials such as for example, polyimide laminates, epoxy resins including FR4 and FR5, bismaleimide triazine (BT), and the like. The core may be ceramic or organic in alternative embodiments.

The signal carrier assembly may in turn be sandwiched between a pair of b-stage prepreg layers, and a conductive layer may be formed on an upper surface of an upper prepreg layer. The prepreg layers in the substrate are added to help adhere layers of the substrate together and to provide additional electrical insulation between layers. Through hole vias 110 may be formed through the layers and plated or filled with conductive material to selectively electrically couple the various conductive layers to each other. The number and position of the vias 110 are shown by way of example only and may vary in further embodiments. A further b-stage prepreg layer may be added on top of the upper conductive layer. This prepreg layer may extend only part way across the surface of the upper conductive layer to form an opening, or window, on the upper surface. That window may be filled with solder mask.

In a differential height embodiment of the substrate, to form the section 100*a* of greater thickness, one or more for additional signal carrying assemblies may be added on top of the existing structure. For example, another b-stage prepreg layer may be added on top of the previously uppermost layer of prepreg and solder mask. Then, a signal carrying assembly may be added, such as by including a pair of conductive layers sandwiching a dielectric core. A final solder mask layer may then be added on top of the structure. At the bottom of the structure, another conductive layer may be added below the previously bottommost layer of prepreg, and then a solder mask layer may be added beneath the new conductive layer. The vias 110 may be extended downward through the newly added conductive layer.

The substrate 100 may then be depth routed to create a vertically planar opening across the substrate. The upper layers above the window filled with solder mask may then be removed in a de-cap process. FIG. 2 is an edge view of a portion of the finished substrate 100, showing a first section 100*a* having more layers and being thicker than a second section 100*b*. The first section 100*a* and the second section 100*b* are contiguous with each other.

Figure 3:
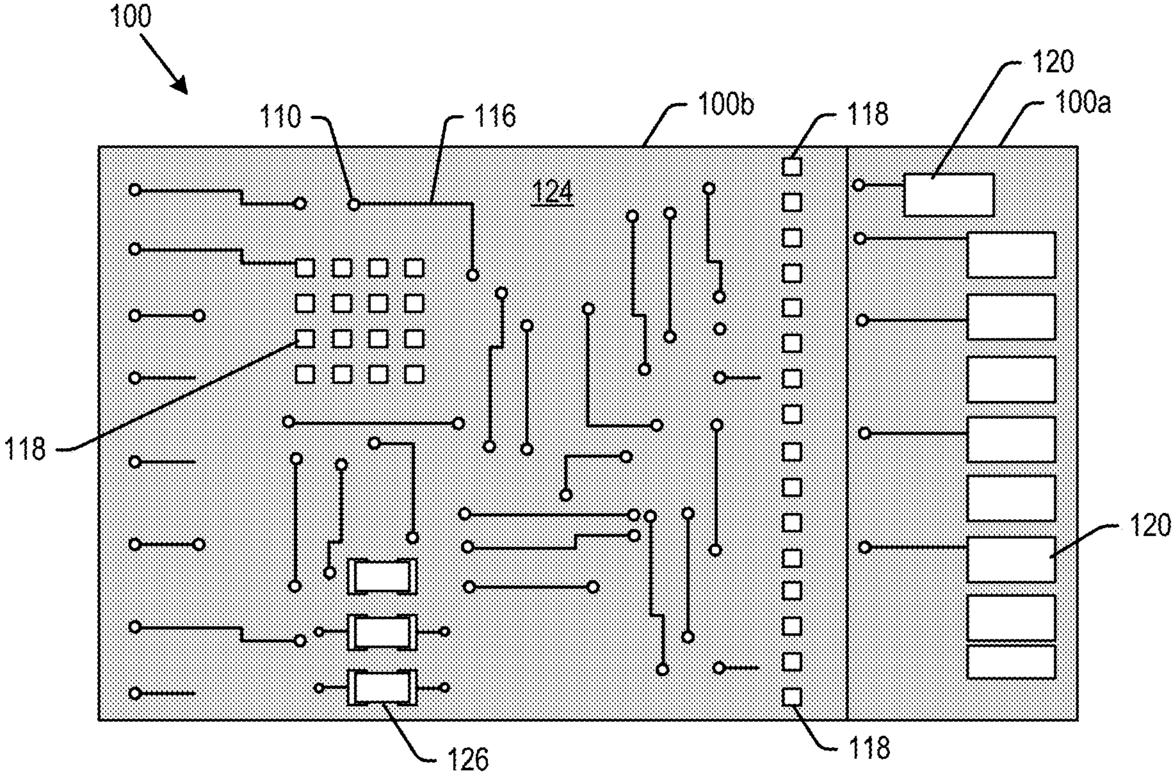
FIG. 3 is a top view of the substrate of FIG. 2.

FIGS. 2 and 3 are edge and top views, respectively, of the completed substrate 100. Prior to application of the final top and bottom solder mask layers, the top and bottom conductive layers may each be individually etched to form conductance patterns comprising electrical traces 116, contact pads 118 and contact fingers 120 (the solder mask layer is omitted from FIGS. 2 and 3 for clarity). One or more of the interior conductive layers may also be etched to include conductance patterns of traces 116 (not shown). The contact pads 118 are provided to receive wire bonds and/or surface mounted components such as semiconductor dies as explained below. The contact fingers 120 are used to connect the completed semiconductor device to socket pins of a host device as explained below. The top and/or bottom solder mask layers may be etched to expose the contact pads 118 and contact fingers 120. The substrate 100 may include a bottom surface 122 which is flat and planar, and a top surface 124 which includes differential height sections 100*a* and 100*b*. Each of the sections 100*a* and 100*b* may also be flat and planar, at different elevations. The pattern of vias 110, traces 116, contact pads 118 and contact fingers 120 shown in FIGS. 2 and 3 is by way of example only and each may vary in further embodiments.

Referring again to FIG. 1, the completed differential height substrate 100 may be inspected and operationally tested in step 52. These inspections may for example include an automatic optical inspection (AOI), an automated visual inspection (AVI) and/or a final visual inspection (FVI) to check for defects, contamination, scratches and discoloration. One or more of these steps may be omitted or performed in a different order in further embodiments.

Assuming the differential height substrate 100 passes inspection, passive components 126 (FIG. 3) may next be affixed to the top surface 124 of the second substrate section 100*b* in a step 54. The one or more passive components may include for example one or more capacitors, resistors and/or inductors, though other components are contemplated. The passive components 126 shown are by way of example only, and the number, type and position may vary in further embodiments. The mounting of passive components, and particularly capacitors, is discussed in more detail below.

Figure 4:
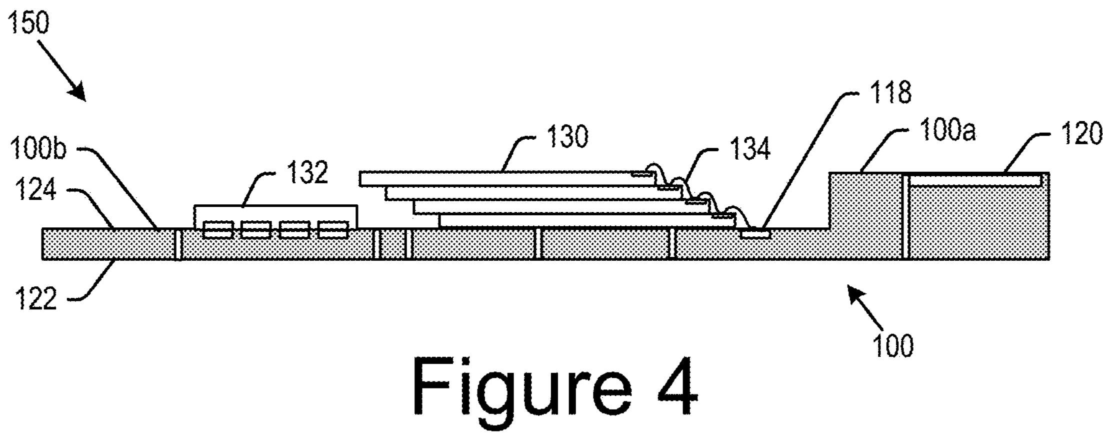
FIG. 4 is an edge view of the substrate including semiconductor dies mounted thereon according to an embodiment of the present technology.
Figure 5:
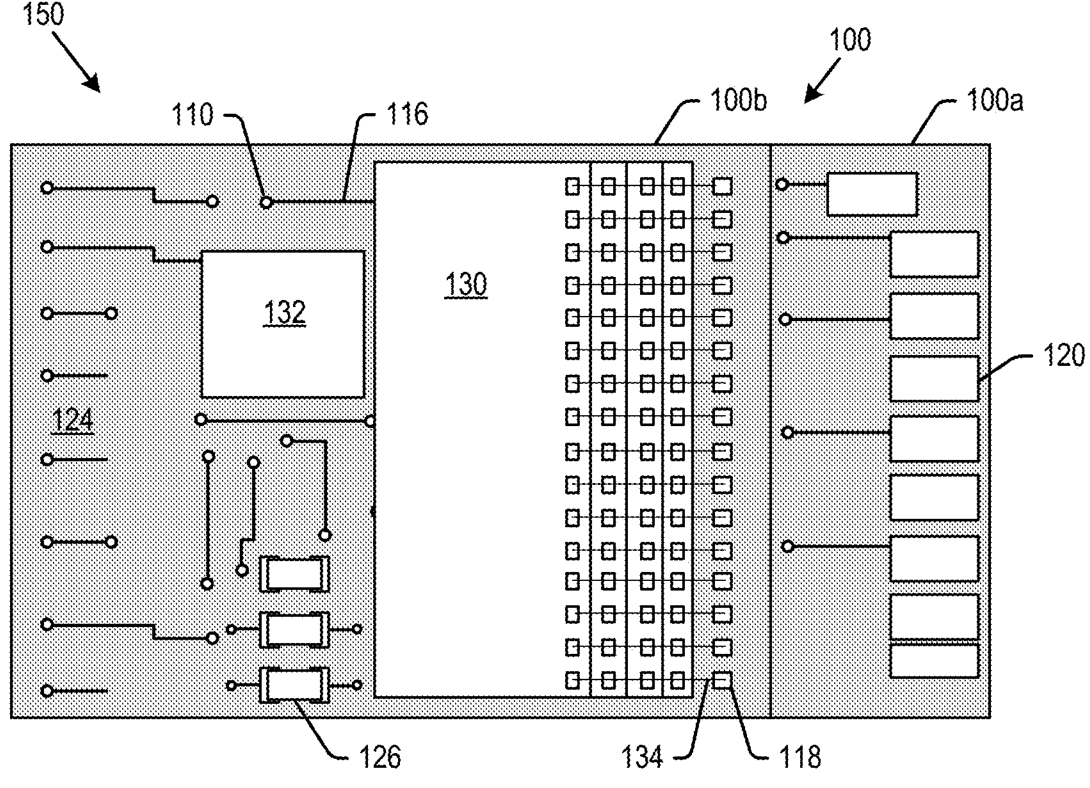
FIG. 5 is a top view of the substrate of FIG. 4.
Figure 6:
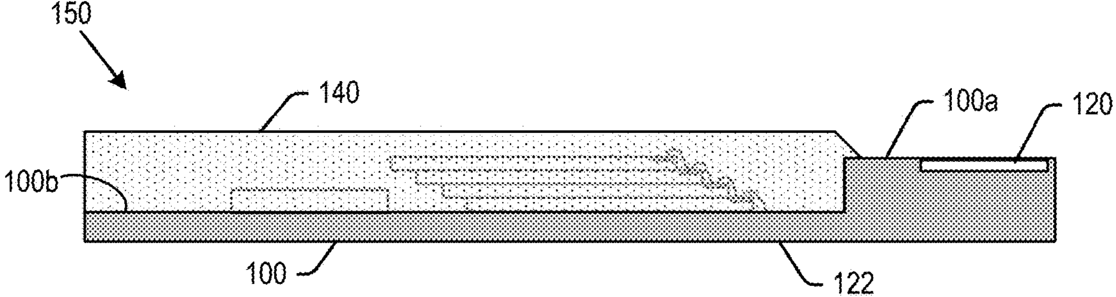
FIG. 6 is an edge view of the semiconductor device according to embodiments of the present technology including a first layer of mold compound encapsulating the semiconductor dies on a first surface of the differential height substrate.
Figure 7:
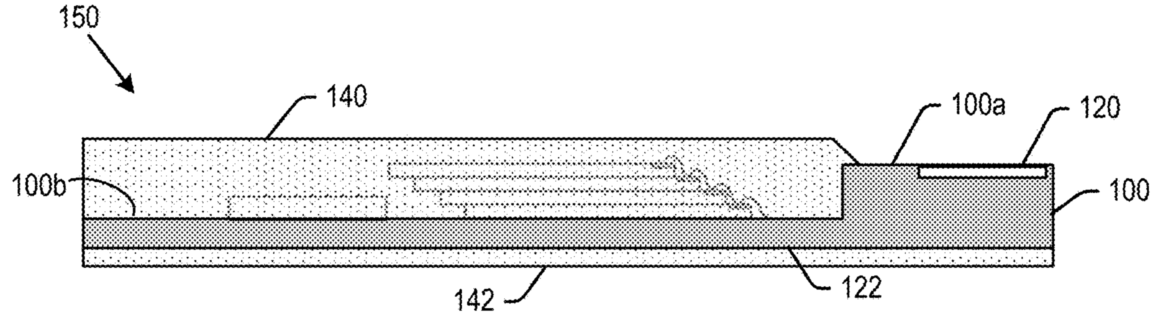
FIG. 7 is an edge view of the semiconductor device according to embodiments of the present technology including a second layer of mold compound encapsulating a second surface of the differential height substrate.

In step 56, one or more semiconductor dies 130, 132 may be mounted on the top surface 124 of the second section 100*b* of the substrate 100. As shown in the edge and top views of FIGS. 4 and 5, respectively, the semiconductor dies 130 may for example be one or more memory dies such as 2D NAND flash memory or 3D BiCS (Bit Cost Scaling), V-NAND or other 3D flash memory, but other types of dies 130 may be used. These other types of semiconductor dies include but are not limited to RAM such as an SDRAM, DDR SDRAM, LPDDR, and GDDR.

Where multiple semiconductor dies 130 are included, the semiconductor dies 130 may be stacked atop each other in an offset stepped configuration to form a die stack as shown in FIGS. 4 and 5. The number of dies 130 shown in the stack is by way of example only, and embodiments may include different numbers of semiconductor dies, including for example 1, 2, 4, 8, 16, 32 or 64 dies. There may be other numbers of dies in further embodiments. The dies may be affixed to the substrate and/or each other using a die attach film. As one example, the die attach film may be cured to a B-stage to preliminarily affix the dies 130 in the stack, and subsequently cured to a final C-stage to permanently affix the dies 130 to the substrate 100.

FIGS. 4 and 5 also show a semiconductor die 132 which may for example be a controller die surface mounted to the differential height substrate 100. Controller die 132 may for example be an ASIC for controlling transfer of signals and data to and from the memory dies 130. The controller die 132 may be flip-chip mounted to contact pads 118 by soldering or Cu-to-Cu bonding. The controller die 132 may alternatively be wire bonded as explained in the following paragraph.

Again referring to FIG. 1, in step 58, the semiconductor memory dies 130 may be electrically interconnected to each other and to the contact pads 118 of the differential height substrate 100. FIGS. 4 and 5 show bond wires 134 being formed between corresponding die bond pads on respective dies 130 down the stack, and then bonded to contact pads 118 on the second section 100*b* of the top surface 124 of the differential height substrate 100. The wire bonds may be formed by a ball-bonding technique, but other wire bonding techniques are possible. The semiconductor dies 130 may be electrically interconnected to each other and the substrate 100 by other methods in further embodiments, including by through-silicon vias (TSVs) and flip-chip technologies. As noted, when not surface mounted, the controller die 132 may also be wire bonded the substrate in step 58. The semiconductor dies 130, 132 are electrically coupled to the contact fingers 120 through the traces 116 and vias 110 of the substrate 100.

Following electrical connection of the dies 130, 132 to the substrate 100, the semiconductor device 150 may undergo a first encapsulation process in step 60. As shown in the edge view of FIG. 6, a mold compound 140 may be applied over the components on the top surface 124 at the second substrate section 100*b* to encapsulate and protect the passive components 126 and the semiconductor dies 130, 132. The mold compound 140 leaves the contact fingers 120 on the first substrate section 100*a* uncovered and exposed. Mold compound 140 may include for example solid epoxy resin, Phenol resin, fused silica, crystalline silica, carbon black and/or metal hydroxide. Other mold compounds from other manufacturers are contemplated. The mold compound may be applied by various known processes, including by FFT (flow free thin) molding, compression molding, transfer molding or injection molding techniques.

The semiconductor device 150 may next undergo a second encapsulation process in step 62 to complete assembly of the semiconductor device 150. As shown in the edge view of FIG. 7, a mold compound 142 may be uniformly applied over the entire flat planar bottom surface 122. The mold compound 142 may be the same or different material used for mold compound 140, and the mold compound 142 may be applied using the same or different process as that used to apply mold compound 140. In the above description, mold compound 142 was applied to the bottom surface 122 after the mold compound 140 was applied to the top surface 124. However, in further embodiments, mold compound 142 may be applied before mold compound 140, or the mold compounds 140 and 142 may be applied simultaneously in a single encapsulation process combining steps 60 and 62. As noted below, the mold compound 142 on the bottom surface 122 may be omitted altogether in further embodiments.

The following discussion considers the mounting of passive components at step 54 in more detail. Although more generally applicable to other devices such as resistors or inductors, the following will use capacitor examples. More specifically, the examples presented below will consider techniques to more efficiently incorporate the mounting of capacitors in the flow of FIG. 1 for the case of relatively large electrolytic capacitors (E-caps) and for using less area on a PCB for the mounting of relatively small capacitors, such as coupling bypass ceramic capacitors.

One technique for installing relatively large electrolytic capacitors on PCBs, such as for an SSD, is to use a vertical dual pin E-cap that uses a special process to solder it to the PCB. This soldering process requires additional steps on top of standard common surface mount device (SMD) component mounting and reflow (i.e., re-entering the primary fabrication flow of FIG. 1). The process is done with special care, separately and offline from the main fabrication flow. The soldering process can be done through a manual soldering process, which requires more time than automated processes, and can also or alternately require use of expensive special equipment, such as for laser soldering or a solder wave process, introducing process delays, additional manufacturing costs Additionally, in case of device failure or defects introduced due to handling, a large electrolytic capacitor mounted in usual soldered approach is difficult to remove and replace.

Figure 8:
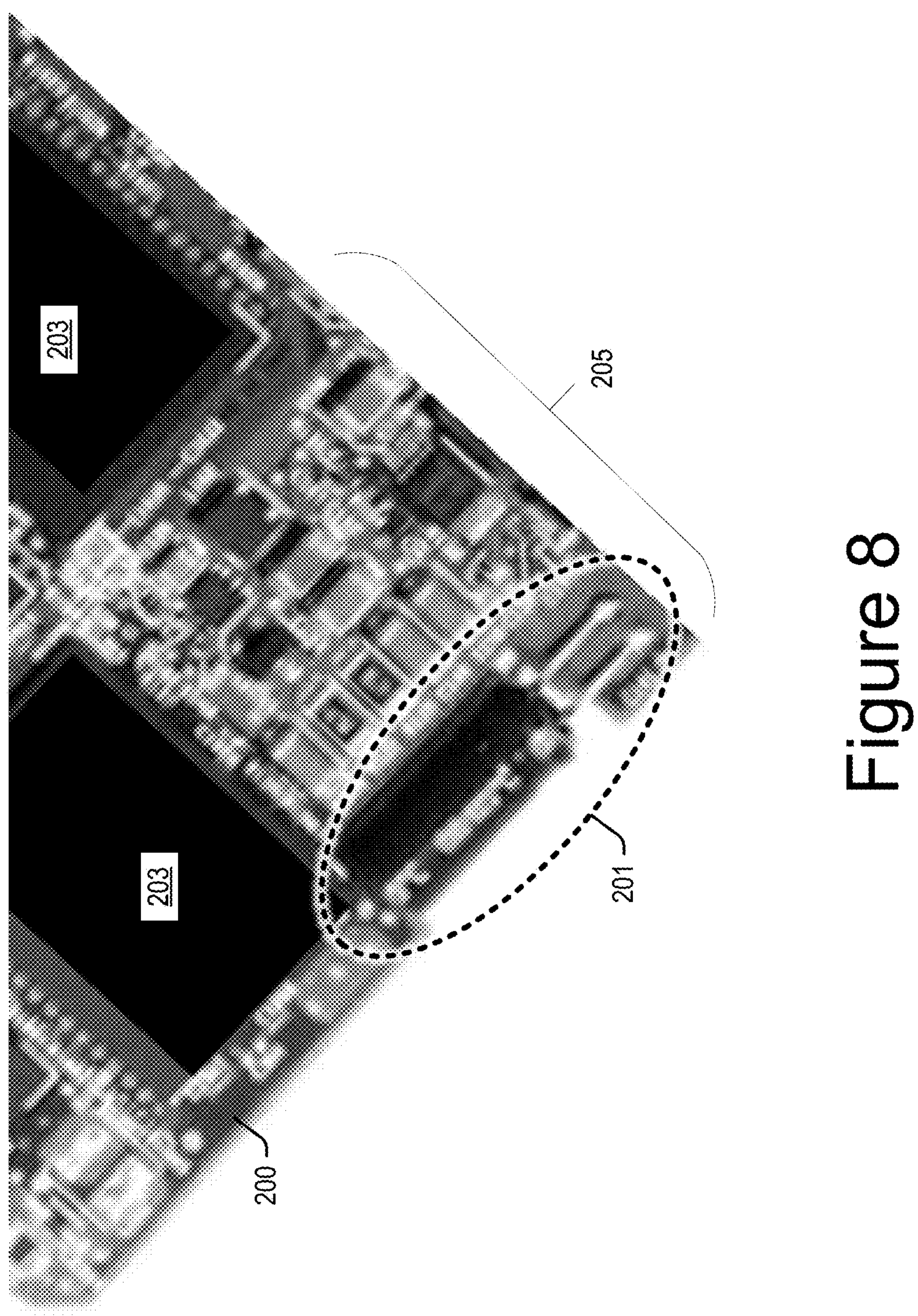
FIG. 8 is an image of portion of a PCB with a large electrolytic capacitor installed by soldering the capacitor solder in a pin through hole arrangement into an open cavity on the PCB.

FIG. 8 is an image of portion of a PCB with a large electrolytic capacitor installed by soldering the capacitor solder in a pin through hole arrangement into an open cavity on the PCB. More specifically, a portion of a PCB 200 has a number of components mounted on its surface, including the die 203, (which may comprise a memory die or a non-volatile memory controller) and passive components and other peripheral elements located in the region 205. In particular, a large capacitor 201 is installed in a notch or cavity of the PCB 200. A large capacitor 201 might, for example, be included on an SSD as a short term backup power source for the SSD, covering brief power loses or providing time to allow saving of parameter values or completion of operations in progress in case of longer power loses, such as from an improper shutdown.

Figure 9:
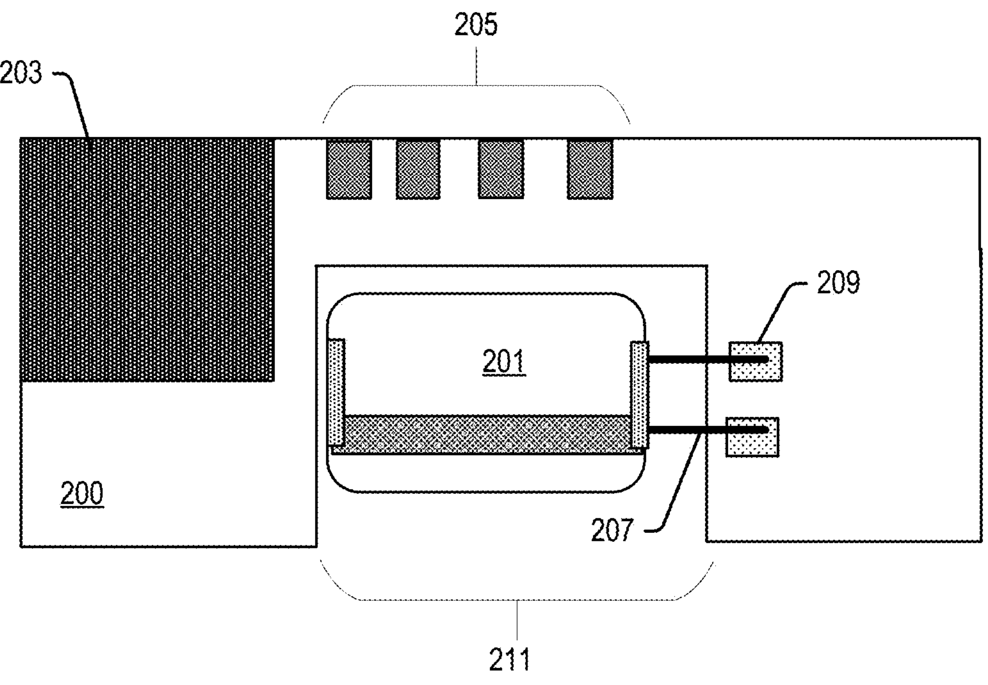
FIGS. 9 and 10 are a top view and side view of a capacitor mounted in an open cavity using a pin through hole type of attachment.
Figure 10:
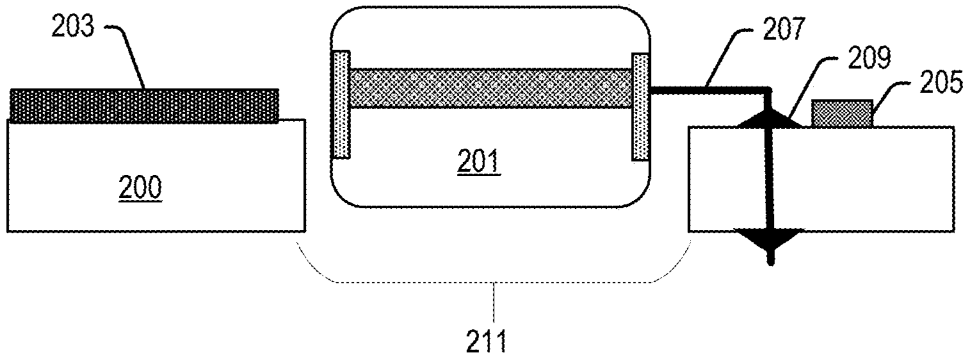

FIGS. 9 and 10 are a top view and side view of a capacitor mounted in an open cavity using a pin through hole type of attachment. The shown portion of the PCB 200 includes a die 203 and several passive elements 205 mounted on its upper surface. The PCB 200 includes a cutout region 211 of a notch or cavity to allow the capacitor 201 to fit within the form factor of the encapsulated SSD. The capacitor 201 includes a pair of pins 207 extending from a side of the capacitor, as shown in the top view of FIG. 9, and are attached by solder 209. As illustrated in the side view of FIG. 10, each pin 207 bends at a right angle and extends through a hole in the PCB 200 where it is attached by solder 209 on both sides of the PCB 200.

The following presents techniques for mounting electrolytic capacitors or other relatively large passive elements to a PCB. The techniques can avoid the use of a laser or wave soldering process and integrates more readily into the fabrication process of FIG. 1 than the pin through hole mounting of FIGS. 8-10. A first set of embodiments, described with respect to FIGS. 11-15, introduces a special E-cap pin channel to allow for surface mount device and reflow processing.

More specifically, an E-cap pin channel is introduced in the substrate to allow for simple placement using, for example, the SMD mount for other passive components, allowing for mounting the E-cap in the main assembly process. This avoids the need for an offline soldering process and the PCB assembly can reflow after solder paste and SMD processing, as in the standard process flow. In the first set of embodiments, the capacitor uses horizontal dual type pins that are placed on a semi-circular or similarly shaped PCB channel or groove to allow the pins to rest easily.

Figure 11:
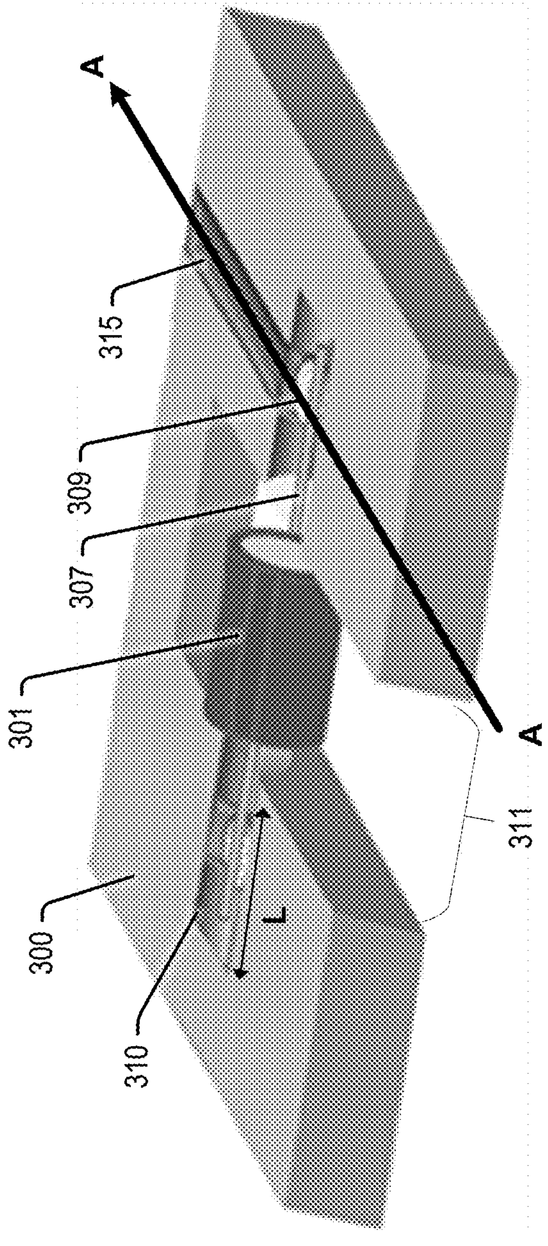
FIG. 11 is an oblique view of an illustration for an embodiment where a large electrolytic capacitor is located in a cavity of a PCB with its pins resting in channels.

FIG. 11 is an oblique view of an illustration for an embodiment where a large electrolytic capacitor 301 is placed in a notch or cavity 311 set into the side of a PCB substrate 300 with its pins 307 resting in channels 310, where only the relevant portion of the PCB is shown. The capacitor 301 or other electrical circuit device is still placed in the notch or cavity 311 of PCB 300, allowing (as in FIGS. 8-10) the use of a large capacitor while still fitting within the form factor of an encapsulated SSD or other device. The embodiment of FIGS. 11-14 has the pins 307 extending laterally on opposite ends of the capacitor 301, but other embodiments can have the pins 307 and channels 310 on same side. The channels 310 to either side can be formed by removing material from the PCB or be formed when forming the substrate as described above with respect step 50 of FIG. 1. In each of the channels is a copper pad 315, where to right the copper pad 315 runs along the upper surface of the PCB 300, while at left only the portion of the copper pad within the channel 310 is exposed. On top of the copper pads 315 within the channels 310 is solder paste 309 to electrically couple the pins 307. This arrangement allows the capacitor 301 to rest in the open cavity 311 with the pins 307 resting in the pin channel 310 over the copper pads 315 for solder 309 contact. The size of the E-cap pin channel groove is shown with length 'L', depth 'H', and diameter 'D' (see FIG. 14) will depends on the capacitor 301 and the size of its pins 307.

Figures 12, 13:
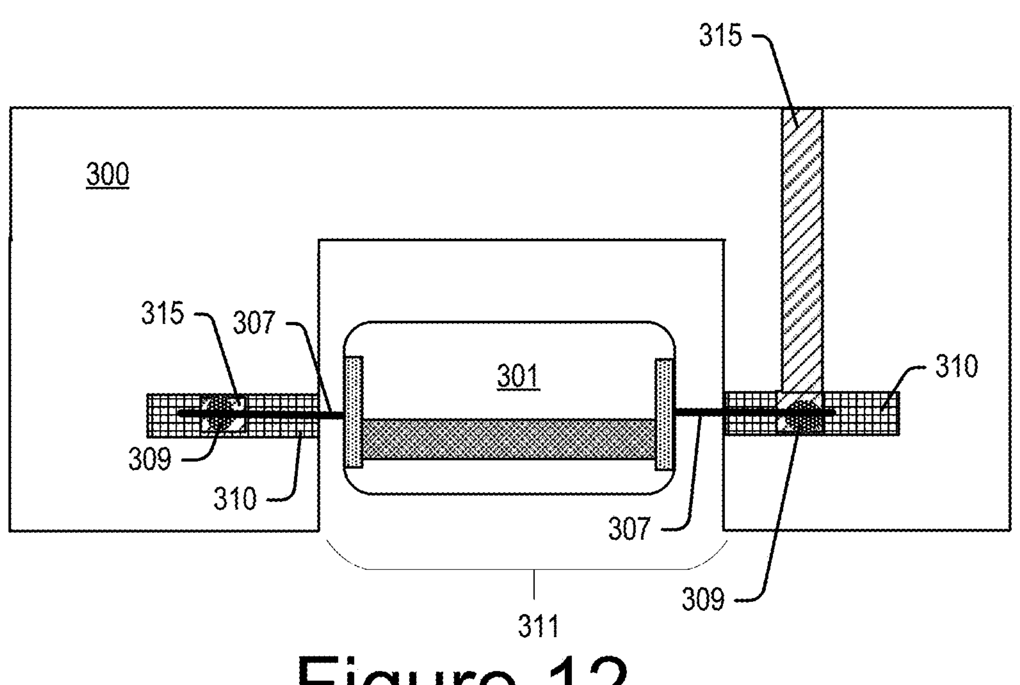
FIGS. 12 and 13 are respectively top and side views of the structure of FIG. 11.

FIGS. 12 and 13 are respectively top and side views of the structure of FIG. 11 illustrating how the capacitor 301 rests within the notch or cavity 311 of the channel with its pins 307 within the channels 310 and resting on the solder paste 309 that is over the copper pads 315.

Figure 14:
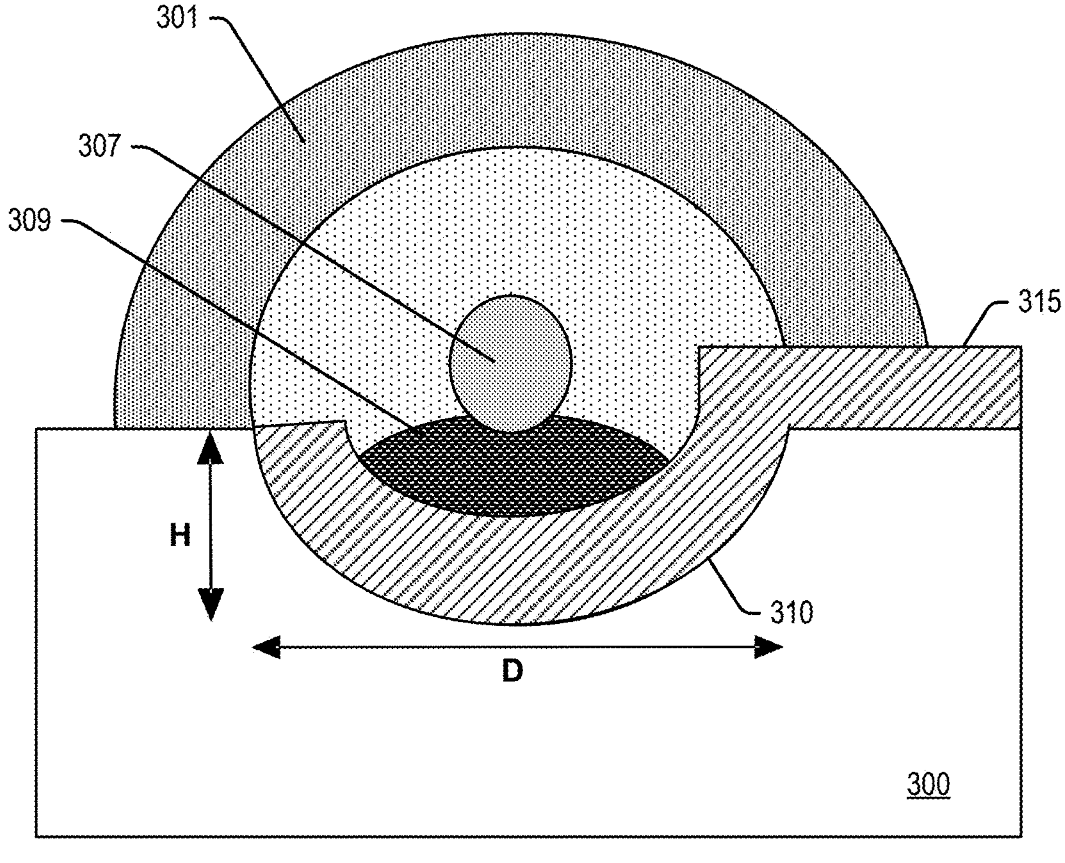
FIG. 14 is a cross-sectional view taken at the cut A-A of FIG. 11.

FIG. 14 is a cross-sectional view taken at the cut A-A of FIG. 11, showing the height H and the width D of the channel 310. The shown embodiment has a semi-circular shape for the channel, but other shapes can be used. The A-A cross-cut illustrates the feasibility of such a channel with the copper solder pads 309 for making contacts to the E-cap pins 307. Such horizontal E-cap pins 307 are normally used for pin through hole or manual solder process as described above with respect to FIGS. 8-10, whereas the arrangement of FIGS. 11-14 allow use a standard surface mount device and reflow process flow.

Figure 15:
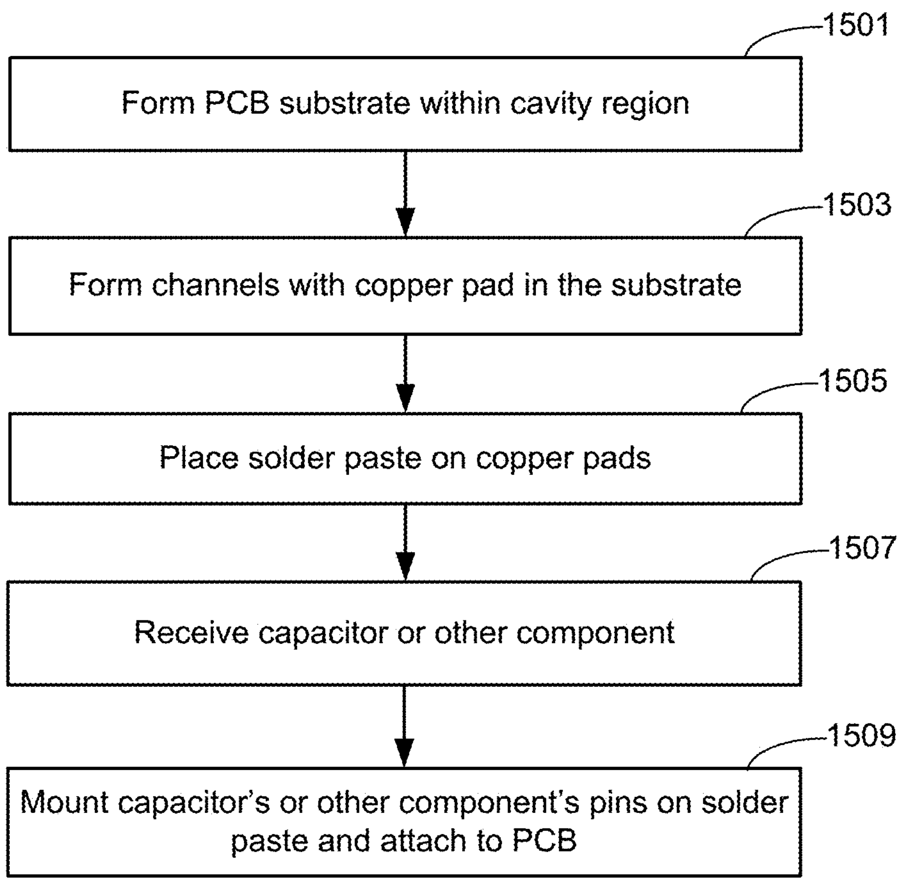
FIG. 15 is a flowchart for an embodiment of forming the structure of FIGS. 11-14.

FIG. 15 is a flowchart for an embodiment of forming the structure of FIGS. 11-14. Beginning at step 1501, the PCB substrate 300 with a notch or cavity 311 is formed. The substrate 300 can be formed as described above with respect to step 50 of FIG. 1, for example, and either be formed to include the cavity 311 or formed without the cavity 311, which is then cut in. At step 1503, the channels 310 with the copper pads 315 are formed in the substrate 300, where this can be incorporated into the formation of the substrate 300 during step 1501 or performed after, depending on the embodiment. The copper pads 315 can be formed as part of forming either the substrate 300 or channels 310 (e.g., being exposed when forming the channels) or can be formed after the channel 310. In the embodiments of FIGS. 11-14, one of channels 310 are formed to either side of the cavity 311 in order to accommodate a capacitor or other component having pins extending laterally to either side, but other arrangements (e.g., both channels on the same side) depending on the device to be mounted in step 1509.

At step 1505, the solder paste 309 is put on the copper pads 315 within the channels 310. The capacitor 301, or other device to be mounted, is received at step 1507, where this step can occur at any point prior to step 1509. The capacitor 301 or other device is then placed with its pins 307 on the solder paste 309 and attached at step 1509.

As described, the embodiment of FIGS. 11-15 can be used with the common horizontal E-cap pin type and take advantage of the surface mount device mounting processes to place the E-cap in the channel. It can also use the same PCB opening cavity as for the embodiments of FIGS. 8-10, but with addition of the semi-circle channel on the PCB design, providing easier rework processing for the E-cap. Consequently, these techniques can remove any special offline process flow and speed up the assembly process time while utilizing the standard assembly process. Additionally, they can prevent E-cap handling damage that can occur when using the offline soldering process, hence improve the assembly yields. Although described with respect to capacitors, these techniques, as well as the embodiments discussed next, can also be applied to other type of component, such as big diodes or fuse placement, if needed.

FIGS. 16-26 present additional embodiments for electrolytic capacitor mounting techniques that can eliminate laser or wave soldering processes by introducing an E-cap pin channel to allow for surface mount device and reflow processing. These embodiments use a direct E-cap placement by solder paste onto copper pads of the PCB. This allows for simple device placement such as through use of a surface mount device mount for mounting the E-cap in the main assembly process. FIGS. 16-20 illustrate a first embodiment and FIGS. 21-24 illustrate a second embodiment, where in both cases the capacitor pins are directly placed on solder paste, which has the advantage of not needing a major PCB modification.

Figure 16:
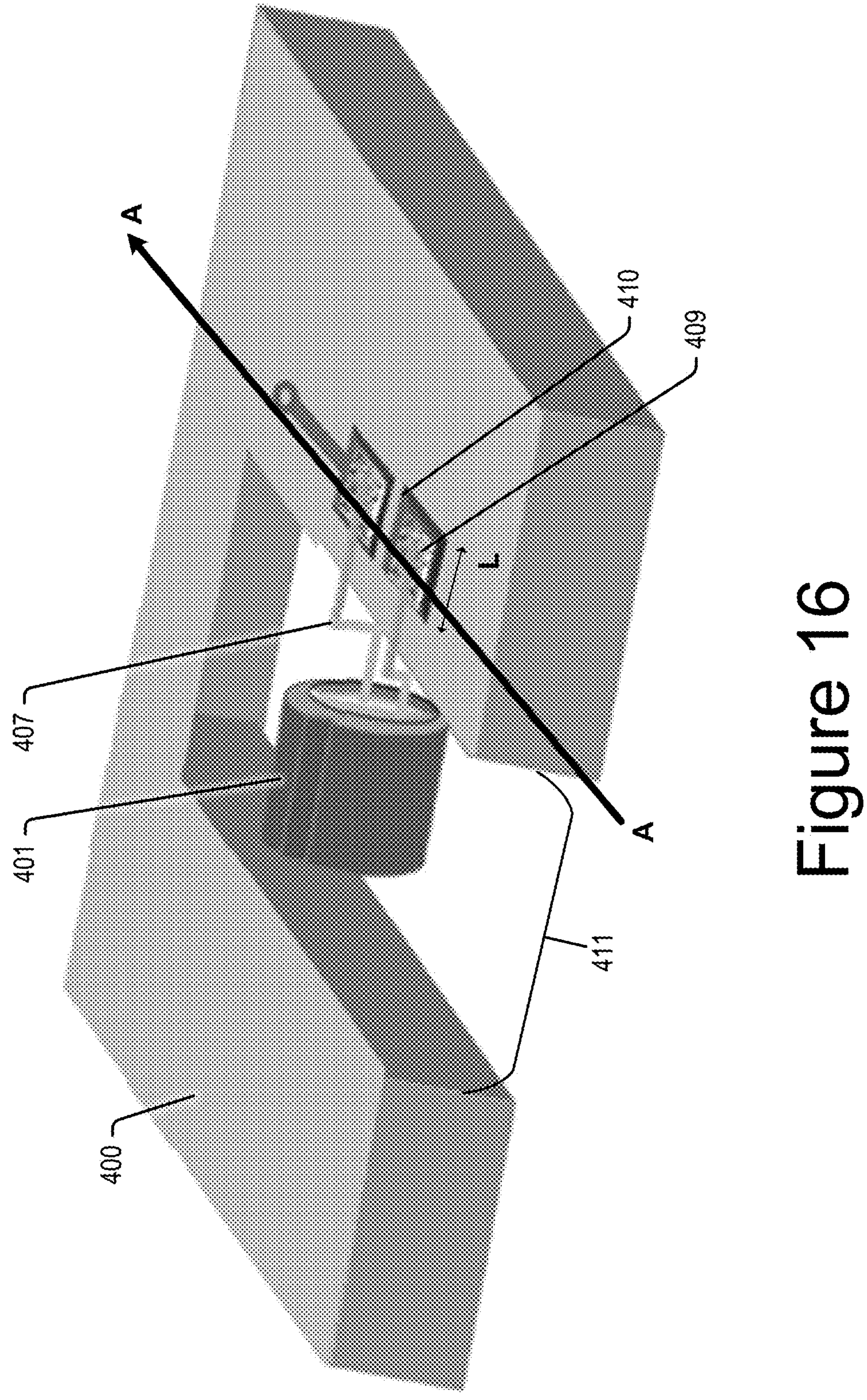
FIG. 16 is an oblique illustration of an additional embodiment for attaching an electrolytic capacitor to a PCB.
Figure 17:
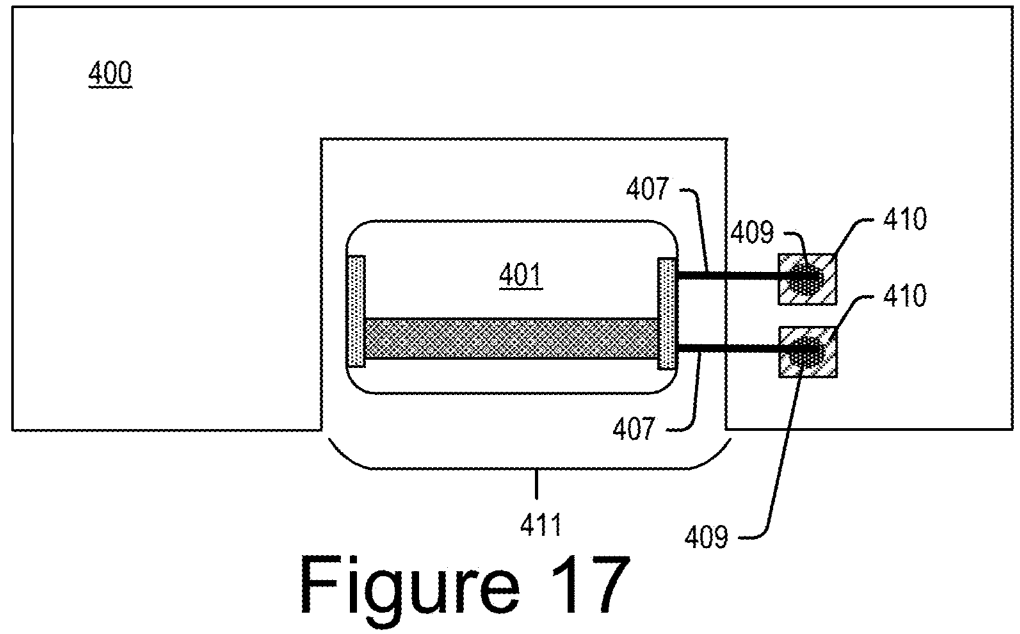
FIGS. 17-20 are respectively top, side, and cross-sectional view of the embodiment of FIG. 16.
Figure 18:
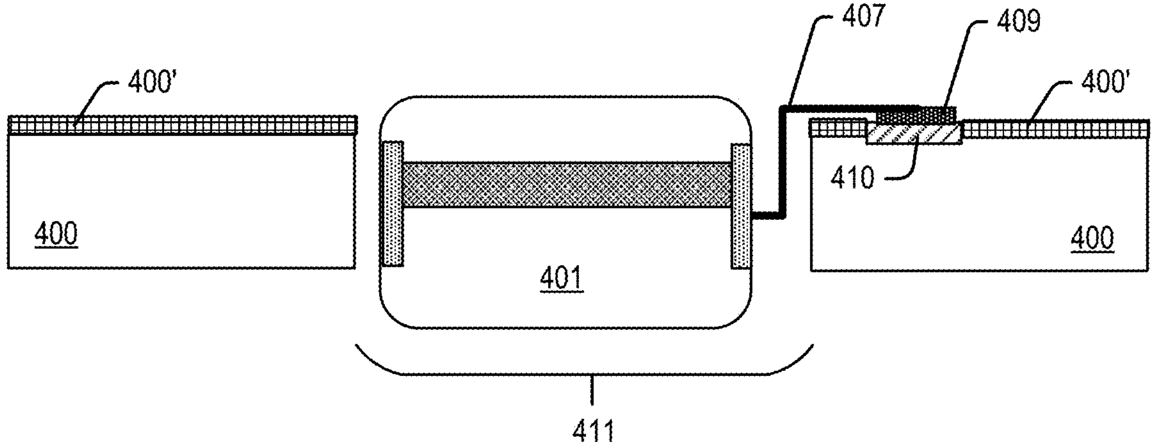
Figure 20:
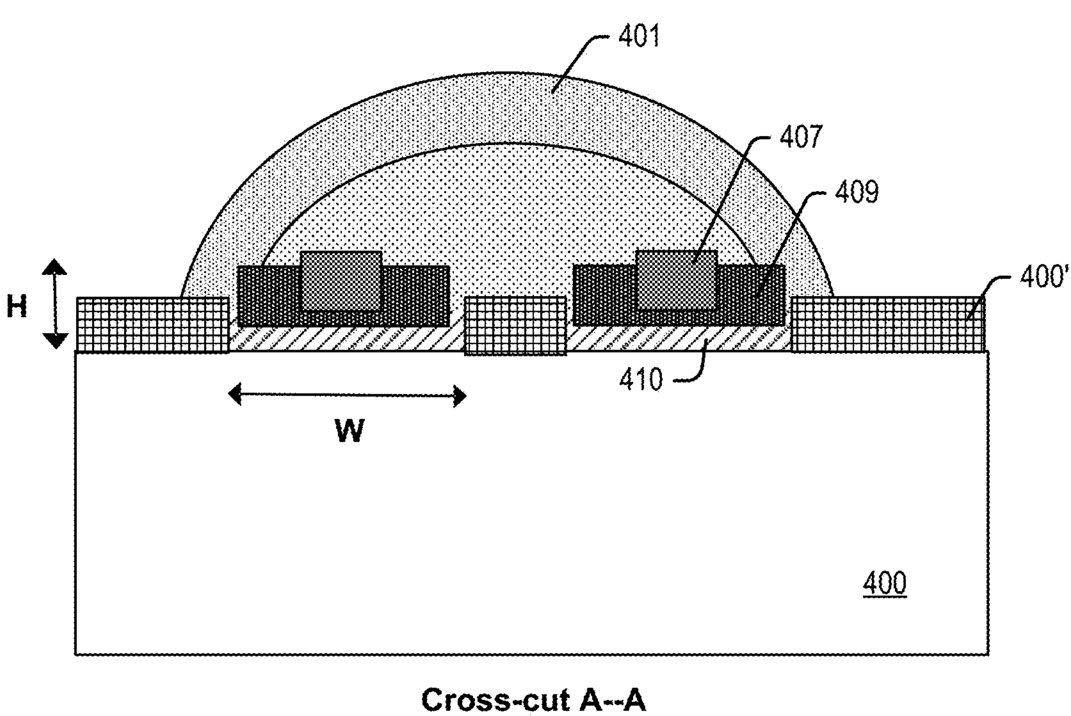
Figure 21:
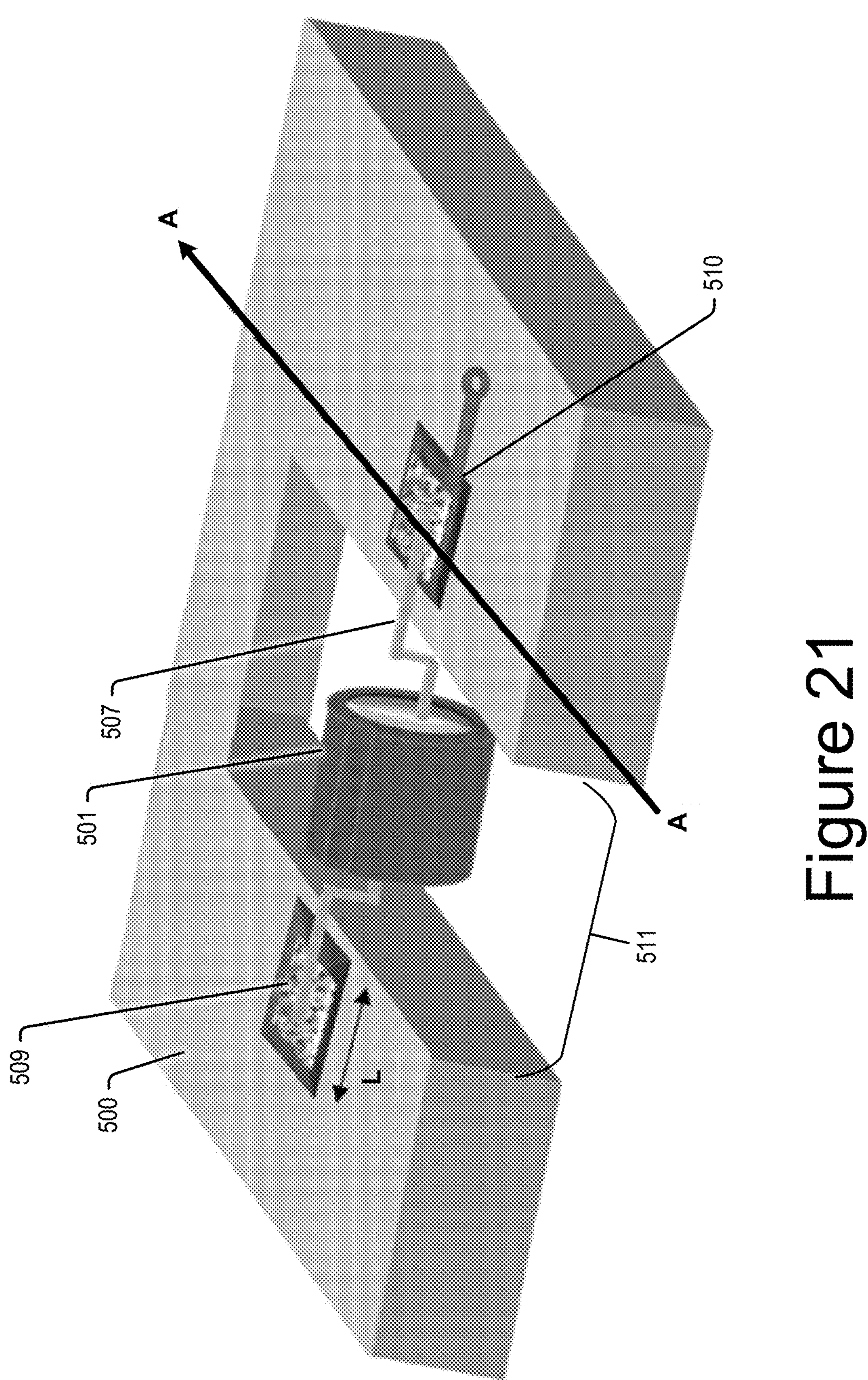
FIGS. 21-25 correspond to FIGS. 16-20 for a 2-sided embodiment of the capacitor pins.
Figures 22, 23:
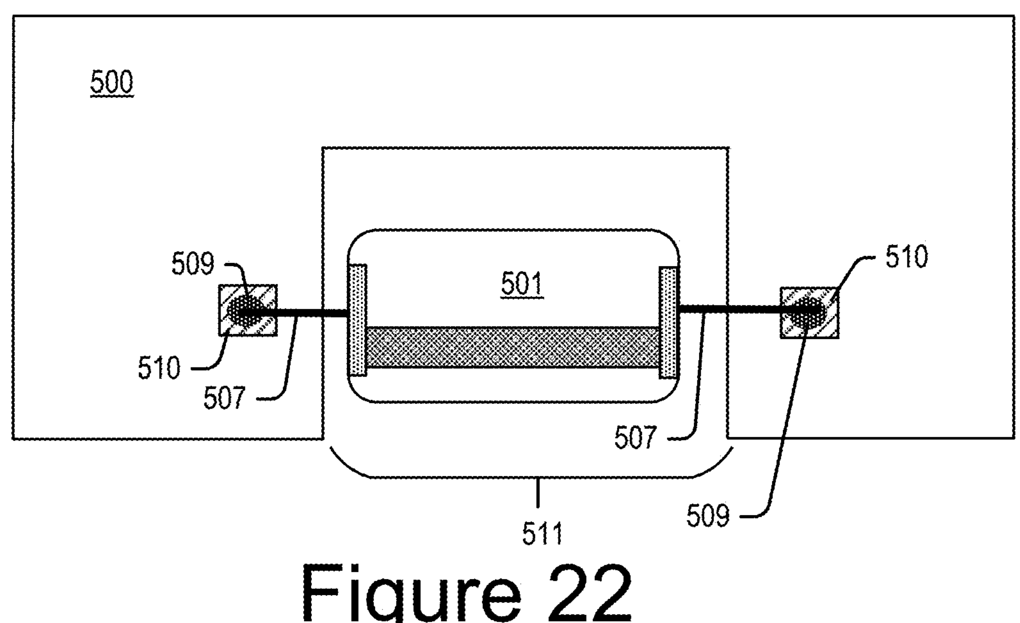

FIG. 16 is an oblique illustration of an additional embodiment for attaching an electrolytic capacitor to a PCB, with FIGS. 17, 18, and 20 respectively showing top, side, and cross-sectional views of the embodiment of FIG. 16. The views of FIGS. 16-18 and 20 are arranged as in the views of FIGS. 11-14, but for an embodiment where the pins and their mounting differs. The electrolytic capacitor 401 is again placed within a notch or cavity 411 into a side of a PCB substrate 400. The pins 407 are on the same end of the capacitor 401 in this embodiment, and are attached to the solder paste 409 on the copper pads. As seen in FIG. 18, in this embodiment the capacitor 401 (or other electrical circuit device) has its bottom somewhat lower that the bottom of PCB 400. The pins 407 extend out horizontally from the capacitor 401, have a right angle bend to extend vertically to above the surface of the PCB 400, have another right angle bend to again extend horizontally, and attach to the solder paste 409 to electrically couple the pins 407 to the contact pads 410. The views of FIGS. 18 and 20 also show a solder mask 400' over the upper layer of PCB 400, into which the copper pads 410 are located. As seen in FIG. 20, which is a cross-section of FIG. 16 at the cut line A-A, the pins 407 have a square cross-section in this embodiment to facilitate the soldering process.

Figure 19:
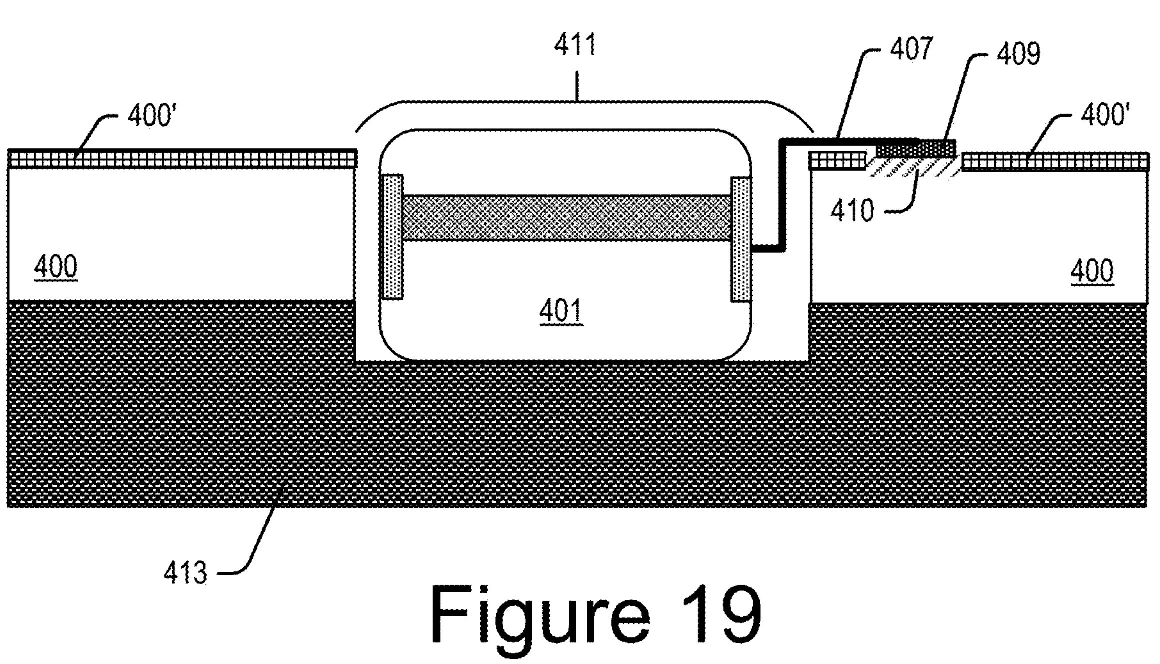

The embodiment of FIGS. 16-20 does not need special laser solder processing and allows reflow after the solder paste and SMD process, as with the standard process flow and on the same machine. A gripper type of nozzle, for example, could be used to place the E-cap on the PCB supported with an SMD pallet on bottom. This is illustrated in FIG. 19, which replicates the features of FIG. 18 supported by an SMD pallet 413 that includes a recessed region for the capacitor 401. The length "L" (see FIG. 16), height "H", and width "W" (see FIG. 20) of the solder paste 409 used depends on the size of the pin 407, but can be designed to accommodate pin placement on the copper pads 410, where it is placed directly upon the solder paste 409. The volume of the solder paste 409 can be based on the best solderability needed for the contact. Using pins 407 with a square shape provides good solder wetting. The use of bent angle leads for the pins 407 for mounting the E-cap 401 allows a lower sink depth to reduce the vertical height. The arrangement of FIGS. 16-20 uses relatively little surface area on the PCB as the copper pads 411 are located close together on the same side of the opening 411. Additionally, as noted above, by having the dual pins 407 on the one side of capacitor 401 having the 90 degree bends, the pins 407 can be placed on the copper pad solder paste 409 to allow the pins to rest easily.

FIGS. 21-25 respectively correspond to FIGS. 16-20, but for a 2-sided embodiment of the capacitor pins. The views of these figures correspond to those of FIGS. 16-20 and are similarly numbered (e.g. PCB 400 is now PCB 500, capacitor 401 is now capacitor 501, and so on). In this embodiment, one of the horizontal pins 507 is on either end of the capacitor 501 and each of the pins 507 has a pair of 90 degree bends to allow the pins 507 to be placed on the copper pad solder paste 509 to allow the pins to rest easily within the void 511. Although this arrangement has support on either end of the capacitor, it uses more surface space on the PCB 500 for the copper pads 510.

Figure 24:
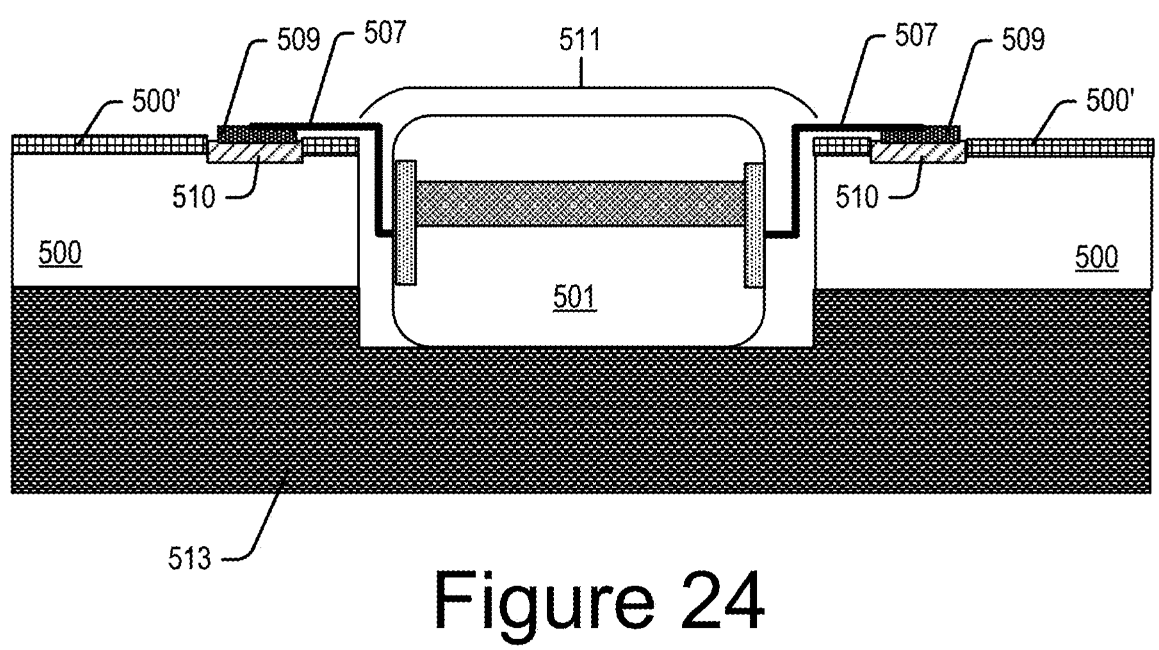
Figure 25:
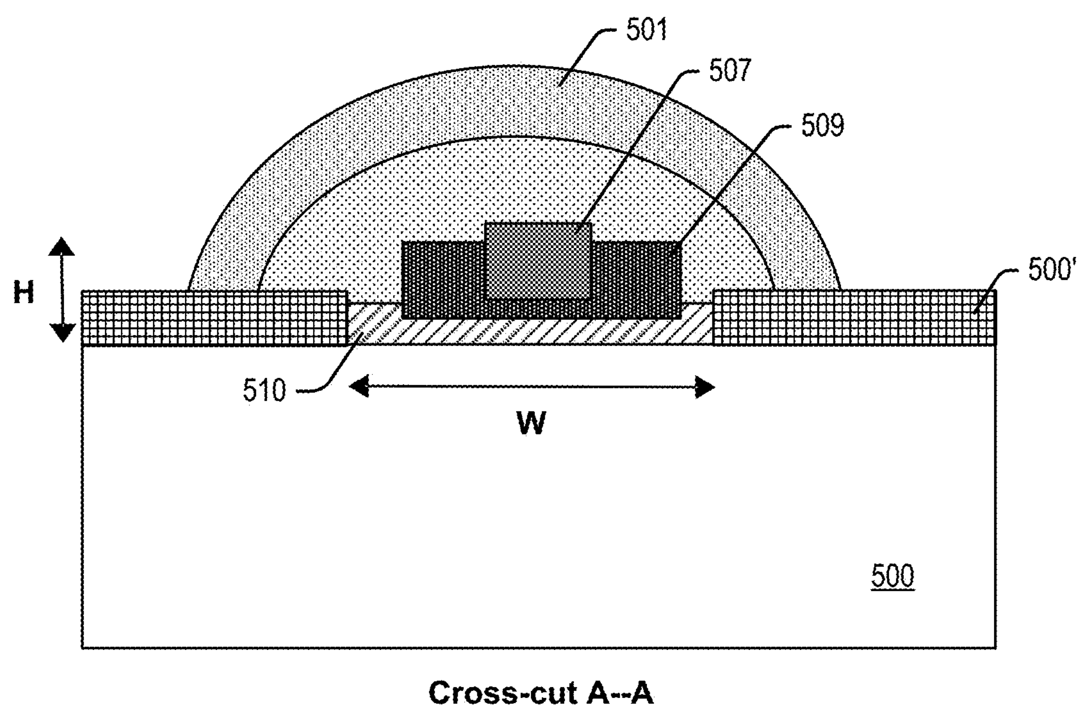

The placement of the capacitor 501 within the open cavity 511 of PCB once the copper pads 510 and solder paste 509 are in place can be largely as described above with respect to FIGS. 15-20. As illustrated in FIG. 24, the E-cap 501 can be held in the open cavity 511 with the E-cap 501 resting on SMD pallet 513, where capacitor 501 can be loaded by SMD processing machinery with gripper type of nozzle, for example. The pins 507 in this embodiment have a square cross-section and dimensions of the copper pad 510 and solder paste 509 can be based on the size of the capacitor 501 and size of its pins 507.

Figure 26:
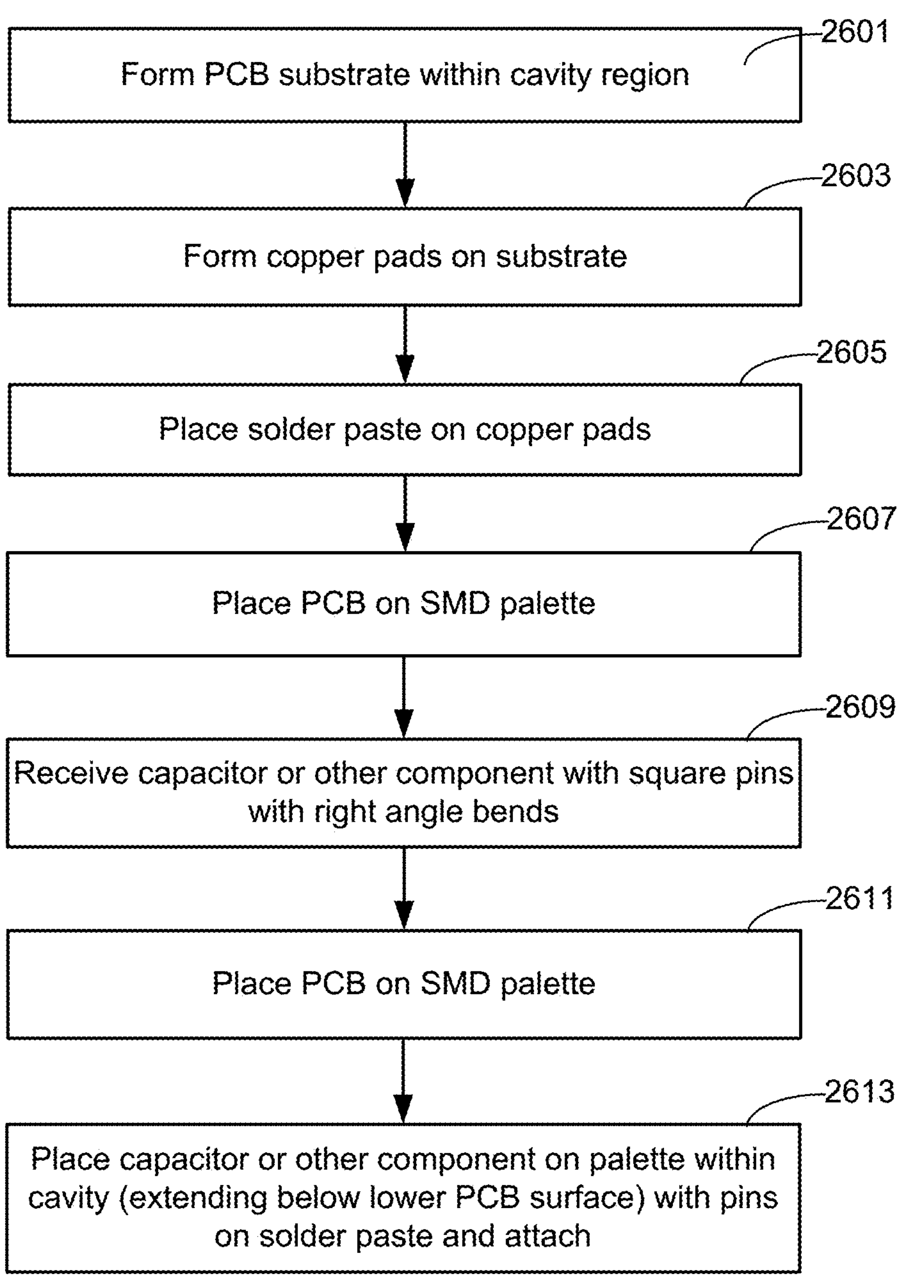
FIG. 26 is a flowchart for an embodiment of forming the structures of FIGS. 16-20 and FIGS. 21-25.

FIG. 26 is a flowchart for an embodiment of forming the structure of FIGS. 16-20 and 21-25. Beginning at step 2601, the PCB substrate 400/500 with a notch or cavity 411/511 in its side is formed. The substrate 400/500 can be formed as described above with respect to step 50 of FIG. 1, for example, and either be formed to include the cavity 411/511 or formed without the cavity 411/511, which is then cut in. At step 2603, the copper pads 410/510 are formed in the substrate 400/500, where this can be incorporated into the formation of the substrate 400/500 during step 2601 or performed thereafter, depending on the embodiment. The copper pads 410/510 can be formed as part of forming either the substrate 400/500 or can be formed afterwards. The placement of the copper pads 410/510 will depend on the location of the pins of the device to be mounted in step 2611 or, alternately, the device can be selected to have a pin configuration based on the copper pad placement. For example, in the embodiments of FIGS. 16-20 the copper pads 410 are placed on the same side of the cavity 411, while in the embodiments of FIGS. 21-25 the copper pads 510 are placed on the opposing sides of the cavity 511. The arrangement of FIGS. 16-20 uses less surface area for the pad placements, while the arrangement of FIGS. 21-25 provide better support for the capacitor or other device during the mounting process and after mounted as it is supported on both ends.

At step 2605, the solder paste 409/509 is put on the copper pads 410/510 and the capacitor 401/501 or other device to be attached is received at step 2607. In the embodiments of FIGS. 16-20 and 21-25, the capacitor 401/501 or other device has pins 407/507 with a rectangular or square cross-section to be more readily attach to the solder paste 409/509. Additionally, in these embodiments the pins 407/507 extend laterally (horizontally relative to the surface of the PCB 500/600) from the side or sides of the capacitor 401/501, bend upward, then bend back to a horizontal to be placed onto the solder paste 409/509, allowing the capacitor 401/501 to sit in the cavity 411/511 so that its center line is below the top surface of the PCB 400/500 and can have its bottom extend below the lower surface of the PCB 400/500. At step 2611, the PCB 400/500 is placed on the surface mount device (SMD) palette 413/513, where this step can occur at any point prior to step 2613. In step 2613, the capacitor 401/501 is placed on the palette 413/513 within the cavity 411/511 with its pins 407/507 on the solder paste 409/509, where the bottom of the capacitor 401/501 below the bottom of PCB 400/500, and the pins 407/507 attached by the solder paste.

For either of the variations of FIG. 16-20 or 21-25, this approach can be used with common horizontal E-cap devices with 90 degree (or near 90 degree) angle in the pins and take advantage of a typical SMD mount process to place the E-cap on the PCB. These embodiments can again use the same PCB opening cavity as for the embodiments of FIGS. 8-10, but provide easier rework process for the E-cap as these two options compared to the more difficult pin through hole rework. These embodiments can also remove high cost soldering process flow, like laser machine or wave soldering, and speed up the assembly process time and will the standard assembly process. As with the embodiments of FIGS. 11-15, the processing of FIG. 16-20 or 21-25 can be deployed on other types of components, such as big diodes or fuse placement.

An approach for reducing the area of the substrate taken up by passive components on the surface of a substrate is hereafter described. The example embodiment will again consider the case of capacitors on the PCB of an SSD, but in this case the capacitors are small capacitors, such as ceramic capacitors used to decouple the inputs to an ASIC (such as a memory controller) from noise or voltage spikes which may result from an electrostatic discharge, or EDS, on an input pin of an SSD. As with circuit designs, the PCB size of SSDs is getting smaller and designs could benefit by releasing some of the area on the PCB surface that is taken up by components other than the ASIC and memory die, such as by bypass or coupling capacitors. This is illustrated by FIG. 27.

Figure 27:
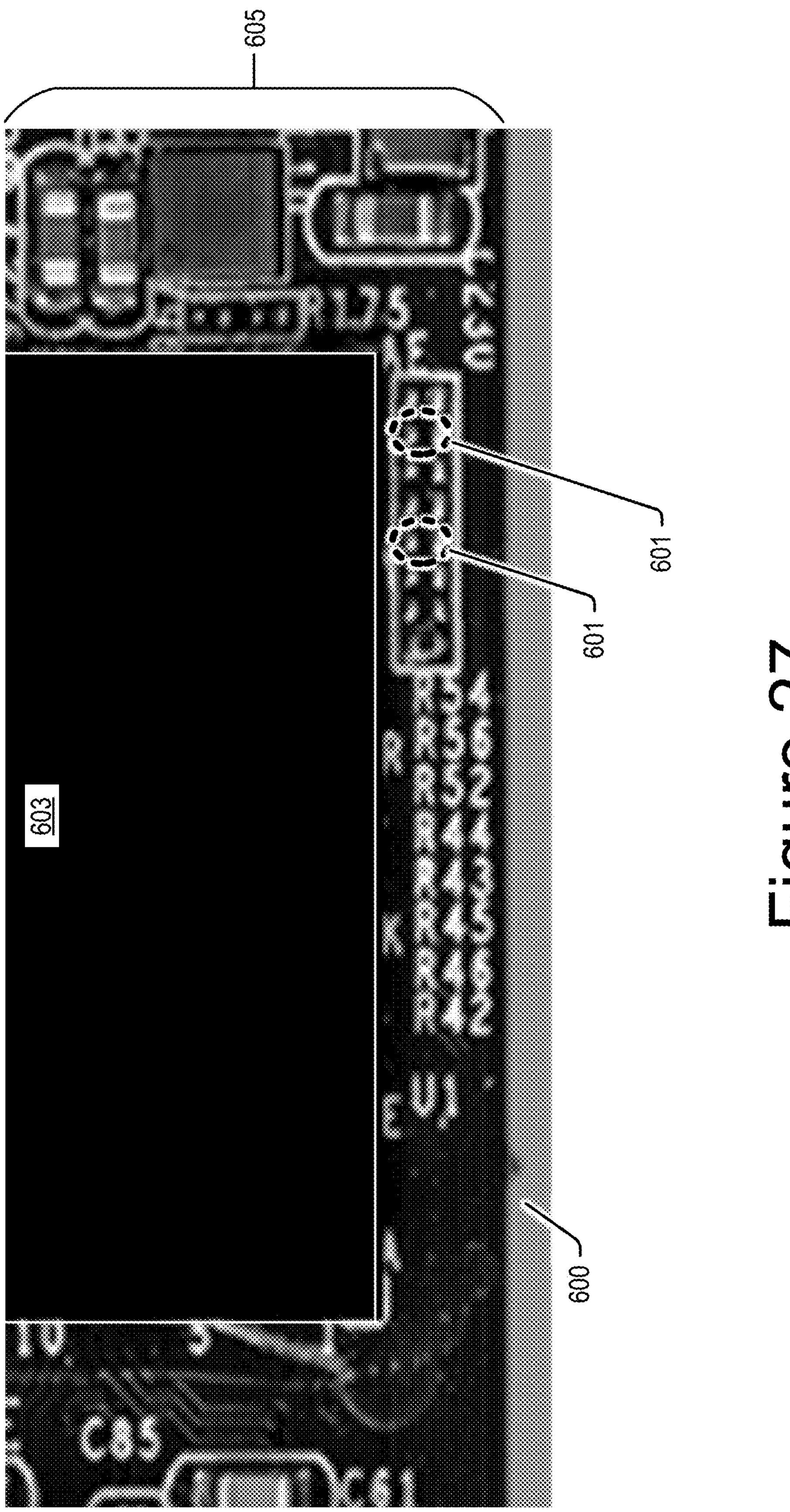
FIG. 27 is an image of a portion of an SSD on a PCB to illustrate one example of the placement of the bypass or coupling capacitors.

FIG. 27 is an image of a portion of an SSD on a PCB to illustrate one example of the placement of the bypass or coupling capacitors. On the shown portion of PCB 600 a controller ASIC or other die 603 is mounted with a number of surface mounted devices 605 along the right side of the die 603. Below the die 603 are also a number of surface mounted capacitors 601, where two have been circled and numbered. For bypass or coupling capacitors, it is desirable to place the capacitor as close to the ball grid array (BGA) or other input pad as possible for better functionality to filter noise/signals. As such, it is desirable to place these capacitors close to the BGA perimeter. There is also the possibility that this sort of surface mounting of the capacitors could lead to capacitor damage or to being shorted while handling or the soldering process in the PCB assembly flow. Another challenge in this usual arrangement is for rework processing to replace the capacitor when it becomes damaged or faulty, or if the ASIC 603 needs replacing due to a bad contact of the capacitor 601. Another consideration is that, as the physical size of capacitors is shrinking, it is more difficult to mount such smaller sized capacitors, and they can become easily damages and thus unusable.

To address these issues, the following introduces the use of a wire bond process for the bypass coupling capacitors. This approach can be used, for example, in a single package type embodiment, without a BGA in the package. The presented embodiments move these capacitors placement to within the ASIC package. This allows for capacitors of a much smaller physical size to be utilized to take advantage of component technology advancements with the correct low capacitance values, without the difficulty of soldering these very small components. More specifically, the following embodiments connect certain ones of the capacitors with bond wires. Bond wires could not previously be used because the pitch of the PCB elements was too small. However, newer wire bond machines can manage such pitches using fine gold wires. A cavity on the PCB substrate is introduced into which the capacitor, or other component, is directly placed. Once the component is placed into the cavity and secured, such as with epoxy to hold it in place, it can be directly wire bonded onto the terminals to make a good contact with the signals by being in close contact to the BGA, or other contact point. These techniques can be illustrated with respect to FIGS. 28-31.

Figure 28:
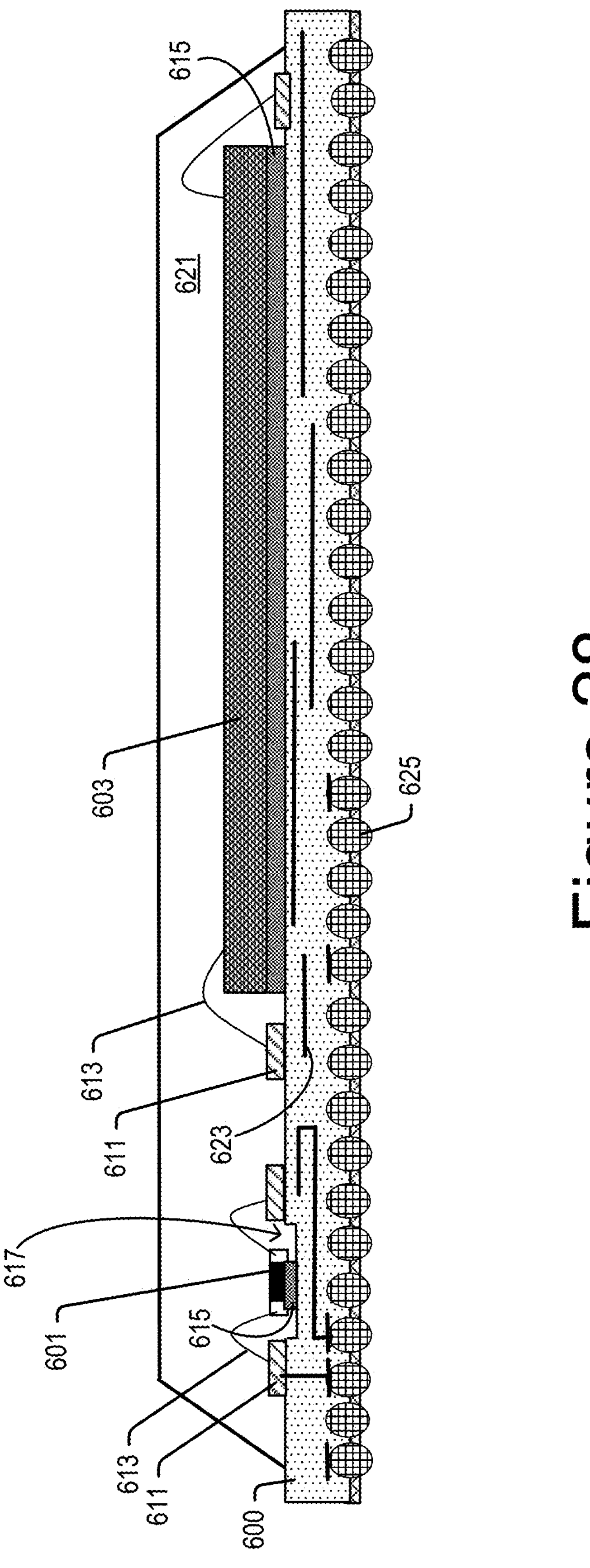
FIG. 28 is a cross-section of a package for an PCB with mounted components.

FIG. 28 is a cross-section of a package for a PCB 600 with mounted components, where a die 603 and capacitor 601 are explicitly shown. In this example, the PCB 600 can include a number of layers, as described above with respect to step 50 of FIG. 1, including conductive layers 623 to connect mounted components. Several copper traces 611 (not all labelled) are shown on the surface of the PCB 600. One or more dies, such as an ASIC or other die 603, is attached to the surface of the PCB 600, such as by an epoxy 615 with wire bonds 613 used to make electrical connections between the ASIC 603 and the copper traces 611. In some embodiments, the structure can be encapsulated within a molding compound 621 and, on the lower surface, a number of solder balls 625 provide a ball grid array for the package.

The cross-section of FIG. 28 also shows a capacitor 601 placed on an epoxy or other adhesive layer 615 for attachment within a cavity 617 recessed into of the upper surface of substrate 600. The capacitor's terminals are attached by wire bonds 613 to the copper traces 611.

Figure 29:
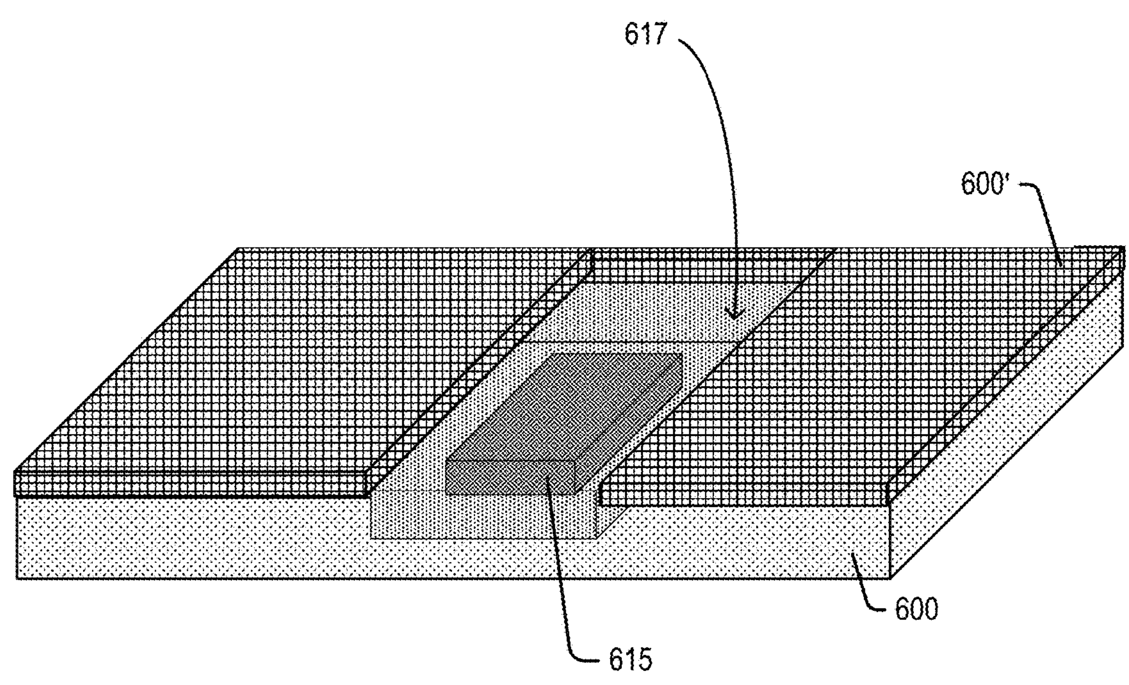
FIGS. 29 and 30 illustrates the structure of FIG. 28 at two stages of forming the structure for the capacitors.
Figure 30:
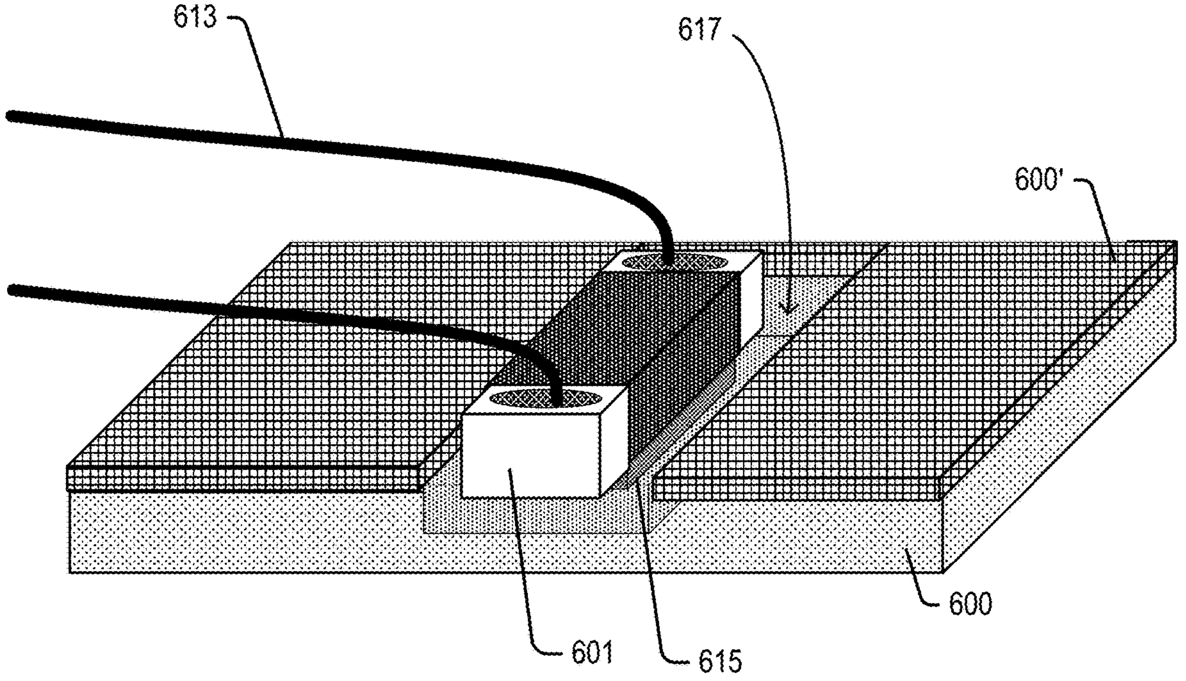

FIGS. 29 and 30 illustrate the structure of FIG. 28 at two stages of forming the structure for the capacitors 601 and the wire bond process. FIG. 29 is an oblique view of a cross-section of a portion of the PCB 600 through the recessed region of cavity 617 where a capacitor will be placed. Over the PCB substrate 600 is solder mask 600' (not shown in FIG. 28). The PCB substrate 600 and solder mask 600' include a recessed region or cavity 617 shaped to hold the capacitor 601 or other device to be connected in the manner. The recessed cavity 617 can be formed in the course of forming the substrate 600 in step 50 of FIG. 1 or can be made by removing material from a completed substrate. An epoxy 615 or other mounting material is placed within the recessed cavity 617, resulting in the structure of FIG. 29. The capacitor 601 with bonded wires 613 is then attached to the epoxy 615, where the wires 613 can be attached to the capacitor 601 before or after it is attached to the to the epoxy 615. The wires 613 can then be bonded to the copper pads 611, as shown in FIG. 28.

Returning to the whole-package cross-section of FIG. 28, the capacitor 601 terminal wires 613 are bonded to the copper pads 611 and the signals can be routed to the closest BGA pads 625 for shortest length. In this arrangement, the number of wire bond contacts should be very minimal considering parallel and common signals are used. Embedded capacitors can also still be used on the substrate surface, but these require solder reflow oven processing compared to direct wire bonding.

Figure 31:
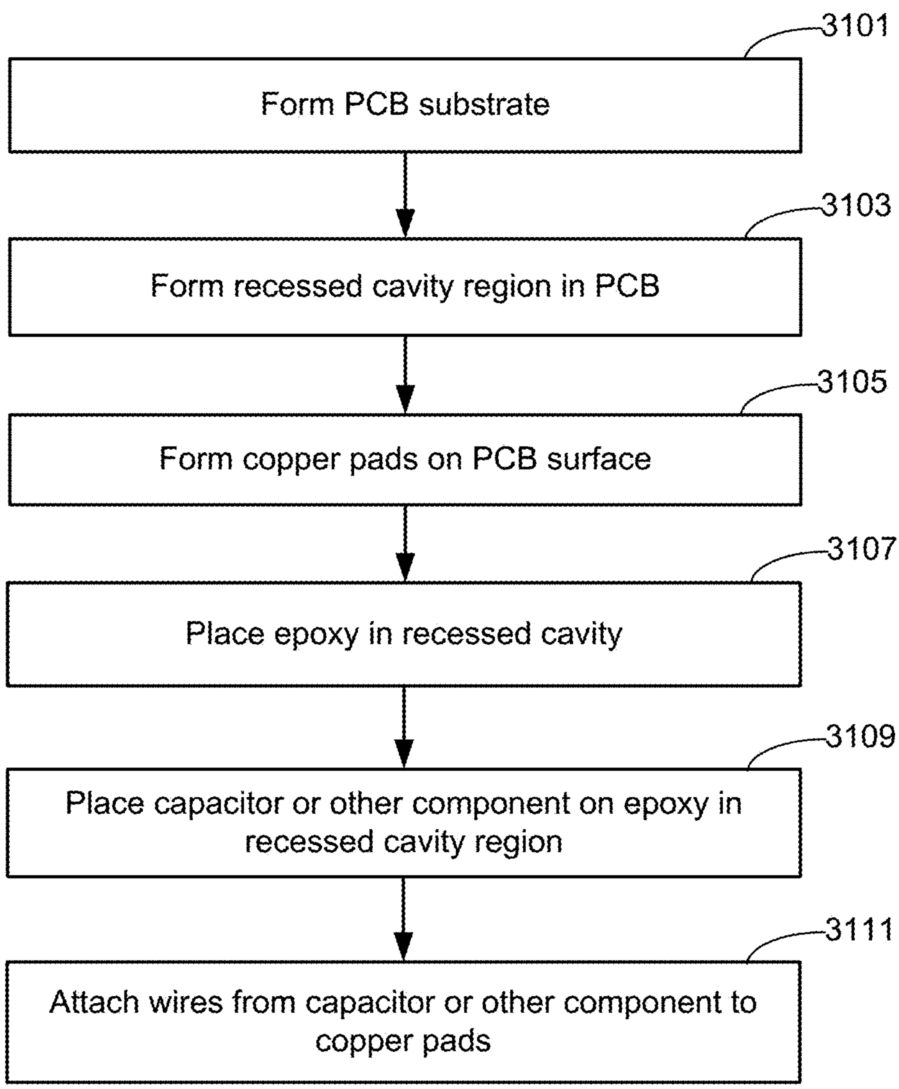
FIG. 31 is a flowchart for an embodiment of forming the structure of FIGS. 27-30.

FIG. 31 is a flowchart for an embodiment of forming the structure of FIGS. 27-30. Beginning at step 3101, the PCB substrate 600 is formed, where this can be done as described above with respect to step 50 of FIG. 1. At step 3103 the recessed cavity 617 is formed into the PCB 600, where, depending on the embodiment, the cavity 617 can be formed as part of the same process as step 3101 or formed into an already formed PCB 600. The copper pads 611 are then formed on the surface of PCB 600 at step 3105, where this can be done at any time between step 3101 and 3111 and would typically be done at the same time as formed other copper pads 611, such as those ASIC or other die 603. In an embodiment using epoxy 615 or other adhesive to attach the capacitor 601 or other device, the epoxy 615 is placed in the recessed cavity 617 at step 3107, where, depending on the embodiment, this can be done at the same time as the epoxy 615 for an ASIC 603 or other die. The capacitor 601 or other component is then mounted on the epoxy 615 in the recessed cavity 617 at step 3109, after which the wires 613 are bonded to the copper pads 611 in step 3111, where, on the capacitor end, the wires can be attached before or after step 3109, depending on the embodiment.

Consequently, the methods described with respect to FIGS. 28-31 can place capacitors without solder reflow processing by use of wire bond contacts to make the signal connections. This approach can free up more PCB area on SSDs and other devices for more circuit relief and other required space between the ASICs mounted on the PCB. It also allows much better functionality for a bypass function for capacitors by allowing letting these to be located closest to the BGA signals with shorter trace lengths, as well as eliminating capacitor usage on the ASIC perimeters and prevent potential damage induced on the capacitor from the PCB assembly process. Although discussed in the context of bypass capacitors for an SSD, these techniques can be used for any embedded style of component on the substrate surface, replacing solder reflow with wire bonds, thereby eliminating reflow oven processing.

Additional embodiments that use radial E-caps or other surface mount devices that include an isolator notch on the end opposing the end with the radially extending pins are hereinafter described. These embodiments use a half-through slot based footprint to support SMD mode assembly and reduce the effective component height. As described in more detail below, the isolator notch of the capacitor can be formed by extending the capacitor's isolation coating and pressing or crimping it. This arrangement allows for a more stable placement of the E-cap with a comparatively smaller area requirement, while using radial pin E-caps in which the pins extend form the same end, which tend be more available, of lower price, and less bulky than axial pin E-caps, such as in FIG. 11, where the pins extend from opposing sides.

Figure 32:
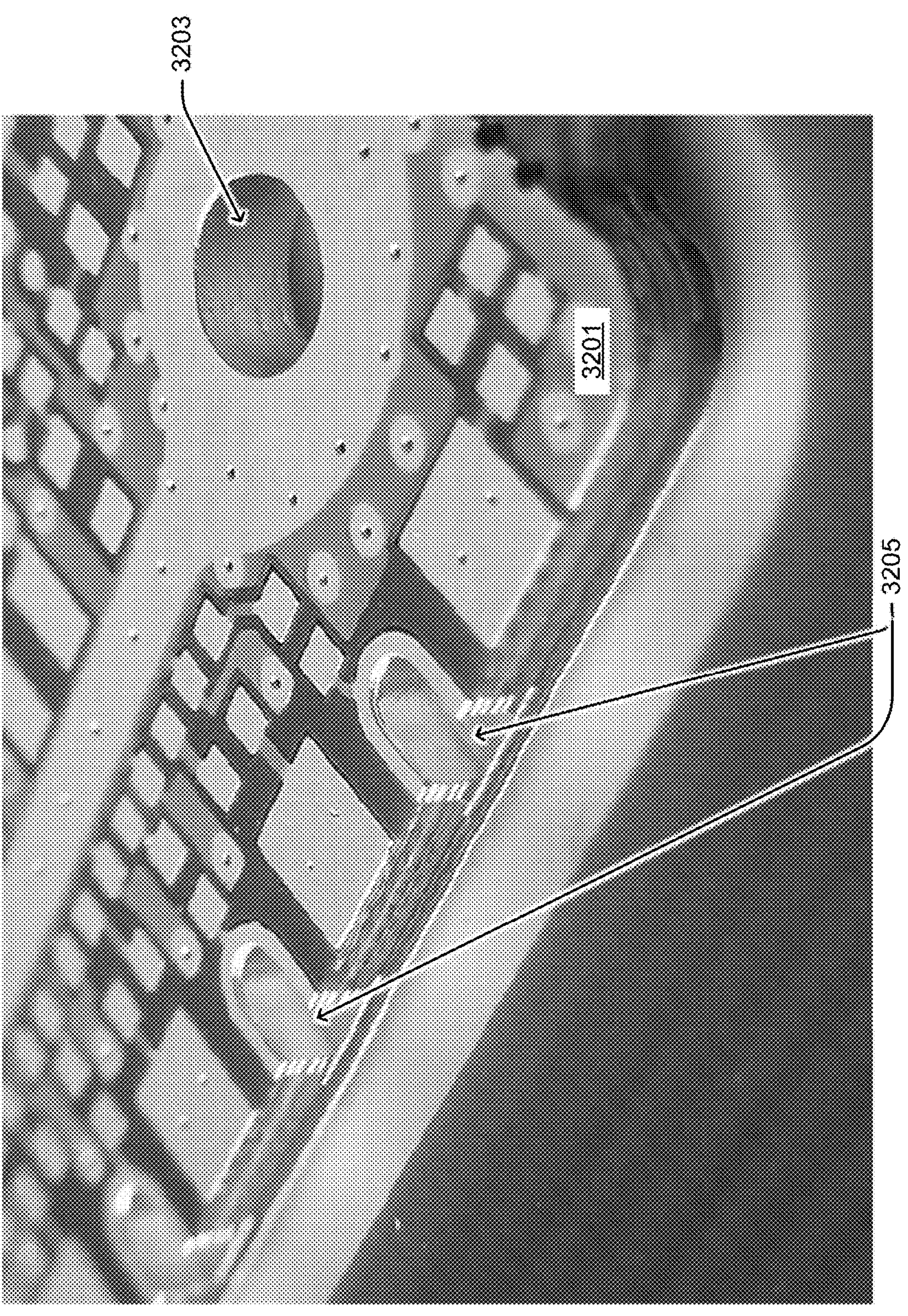
FIG. 32 is an image of a printed circuit board with plated half-through slots.

More specifically, the following embodiments use plated and non-plated half-through slots for assembling the electrolytic capacitors in an efficient way. Relative to the typical arrangements, the following embodiments include an extra insulator notch on the electrolytic capacitor (or other surface mount device) and can reduce pin lengths by using plated half through slots (plated grooves) for the capacitor pins on the PCB and non-plated half slot for capacitor notch. FIG. 32 illustrates the plated half-through slots, where although referred to in the following a "half-through", it will be understood that this more generally is meant as partially, although not necessarily half-way, through the PCB.

FIG. 32 is an image of a printed circuit board with half-through slots plated or otherwise lined with a conductive coating, such as plated with copper. The PCB 3201 shows several plated half-through slots, with two labelled at 3205. These half-through slots 3205 extend through several, but not all, of the layers into the PCB 3201 and are lined with a conductive material, such as being plated with copper. For comparison, an opening extending all of the way through the PCB is shown at 3203. As with the other embodiments described above, the circuit board can be part of an SSD or other electronic device and have contact fingers to couple the semiconductor device to a host device. There will typically be one or more semiconductor dies mounted on the upper surface of the PCB substrate (e.g., one or memory chips and memory controller) and coupled to the contact fingers. The difference in the following embodiments relates to how the capacitors, or other electrical devices, are mounted and connected to the plated half-through slots to the semi-conductor dies or other circuitry of the PCB.

Figure 33A:
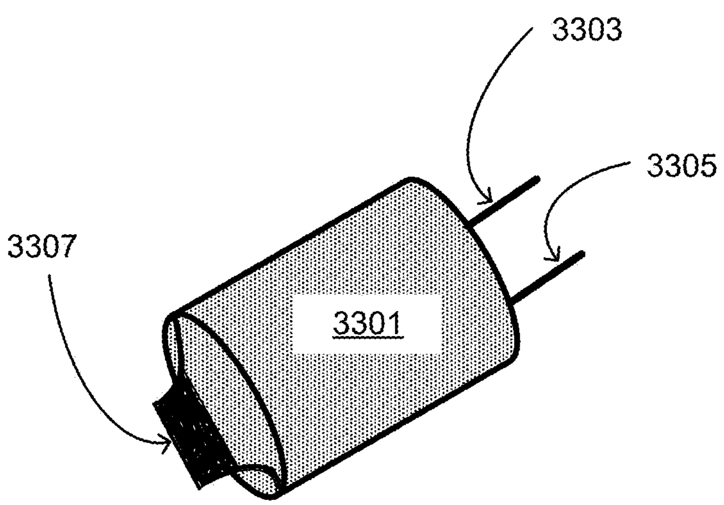
FIGS. 33A-33D illustrate embodiments for radial E-caps with an insulator notch and their manufacture.

FIGS. 33A-33D illustrate embodiments for radial E-caps with an insulator notch and their manufacture. FIG. 33A illustrates a first embodiment of a capacitor structure having radial pins and an opposing insulator notch. The capacitor 3301 of the first embodiment includes a pair of capacitor pins 3303 and 3305 extending radially from a first end. The opposing end of the capacitor 3301 includes a capacitor insulator notch 3307. In the embodiment of FIG. 33A, both of the pins 3303 and 3305 have the same length.

Figure 33B:
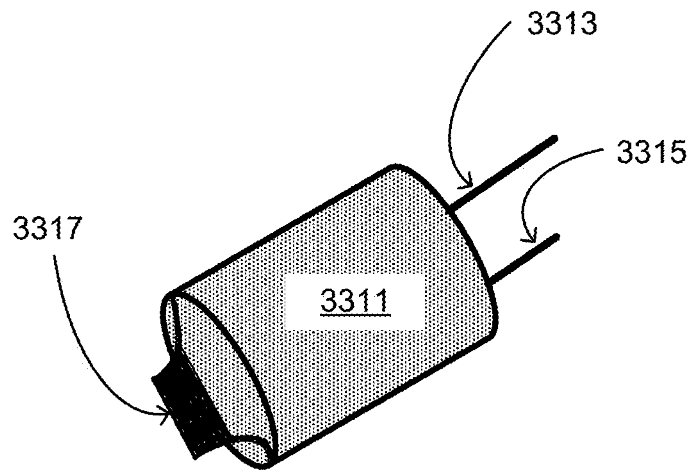

FIG. 33B illustrates another embodiment of an E-cap 3311 with a pair of radial pins 3313 and 3315 on one end and an insulator notch 3317 again on the opposing end. The embodiment of FIG. 33B differs from that of FIG. 33A in that the pins 3313 and 3315 are of differing lengths. This allows for the positive, or high, voltage pin to be differentiated from the negative, or low, voltage pin. For example, the longer pin 3313 can correspond to the higher voltage input and the shorter pin 3315 can correspond to the lower voltage input.

Figure 33C:
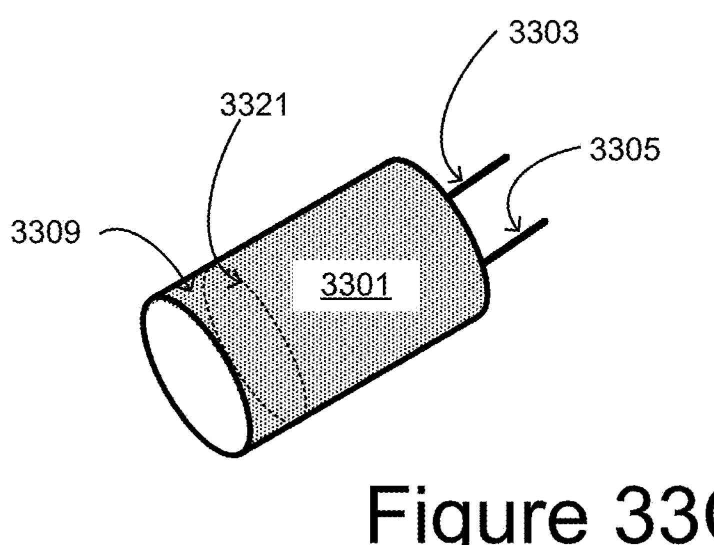

To manufacture a capacitor 3301 or 3311 of FIG. 33A or 33B, the radial pin capacitor can be manufactured as normal in its initial stages. The last stage of electrolytic capacitor manufacturing is typically providing the insulator covering for the capacitor. During this process, the manufactures can provide an extension of insulator role. This is illustrated with respect to FIG. 33C. FIG. 33C illustrates a capacitor 3301 with radial pins 3303 and 3305, as in the embodiment of FIG. 33A, but with the insulating covering extending beyond the end of the capacitor 3301 (the dotted circular line 3321) and not yet pressed or crimped into the notch 3307. This extension 3309 of the insulating covering can then be pressed or crimped properly and make a notch 3307 on the capacitor's top side as shown in FIG. 33A. This notch can then be placed on a non-plated half-through slot of a PCB during assembly.

Figure 33D:
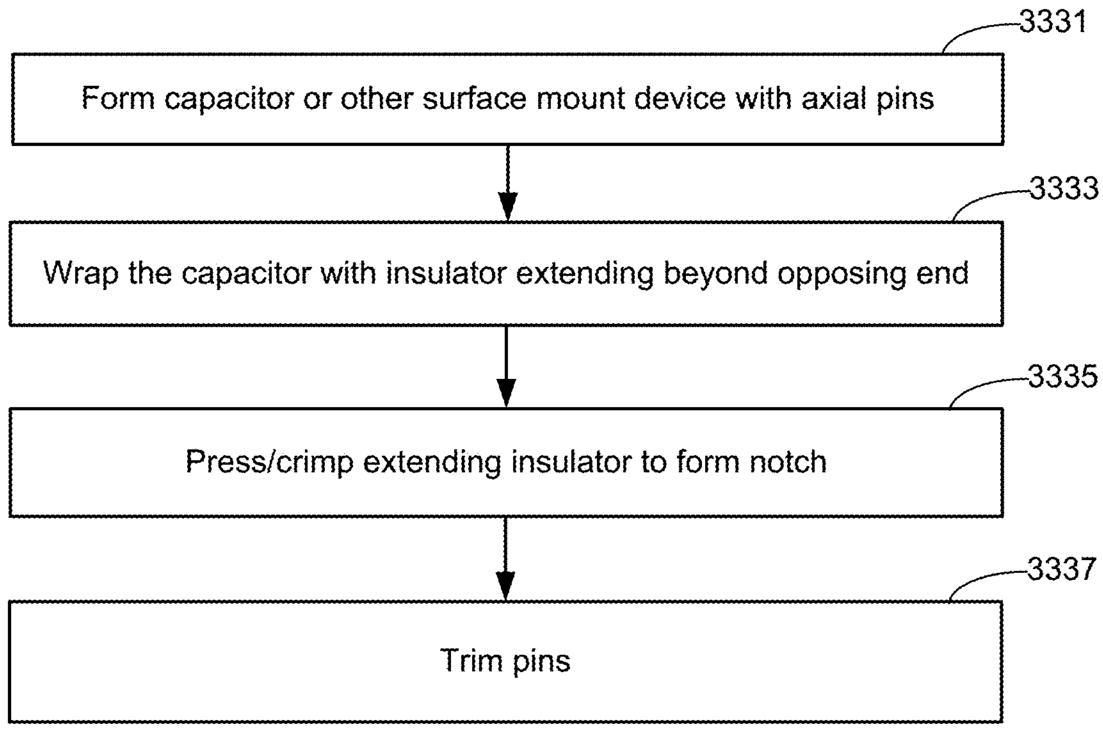

FIG. 33D is a flowchart for an embodiment for manufacturing a capacitor with radial pins and an insulator notch on the opposing end. Beginning at step 3331, an E-cap or other surface mount device is formed, where this can be standard processing. In step 3333, the device is wrapped with an insulator, similar to the standard process, but with the insulator 3309 extending beyond the end of the device. The portion of the capacitor 3301 extending beyond the end (the lighter weight, broken circular line 3321) of the capacitor 3301 is then pressed or crimped at step 3335 to form the notch 3307. Normal pressing of the extended insulator section 3309 will make a wider notch 3307 on the capacitor, where the size of the notch is formed to fit into the correspond notch of the PCB, as described with respect to FIG. 34. If needed, step 3337 can either reduce the length of pins 3303 and 3305 for the capacitor before the manufacturing, or after the manufacturing can be cut and reduce the pin length, such as illustrated in the embodiment of FIG. 33B. These processes need not make any parameter changes in the capacitor, such as capacitance or other parameter changes.

Figure 34:
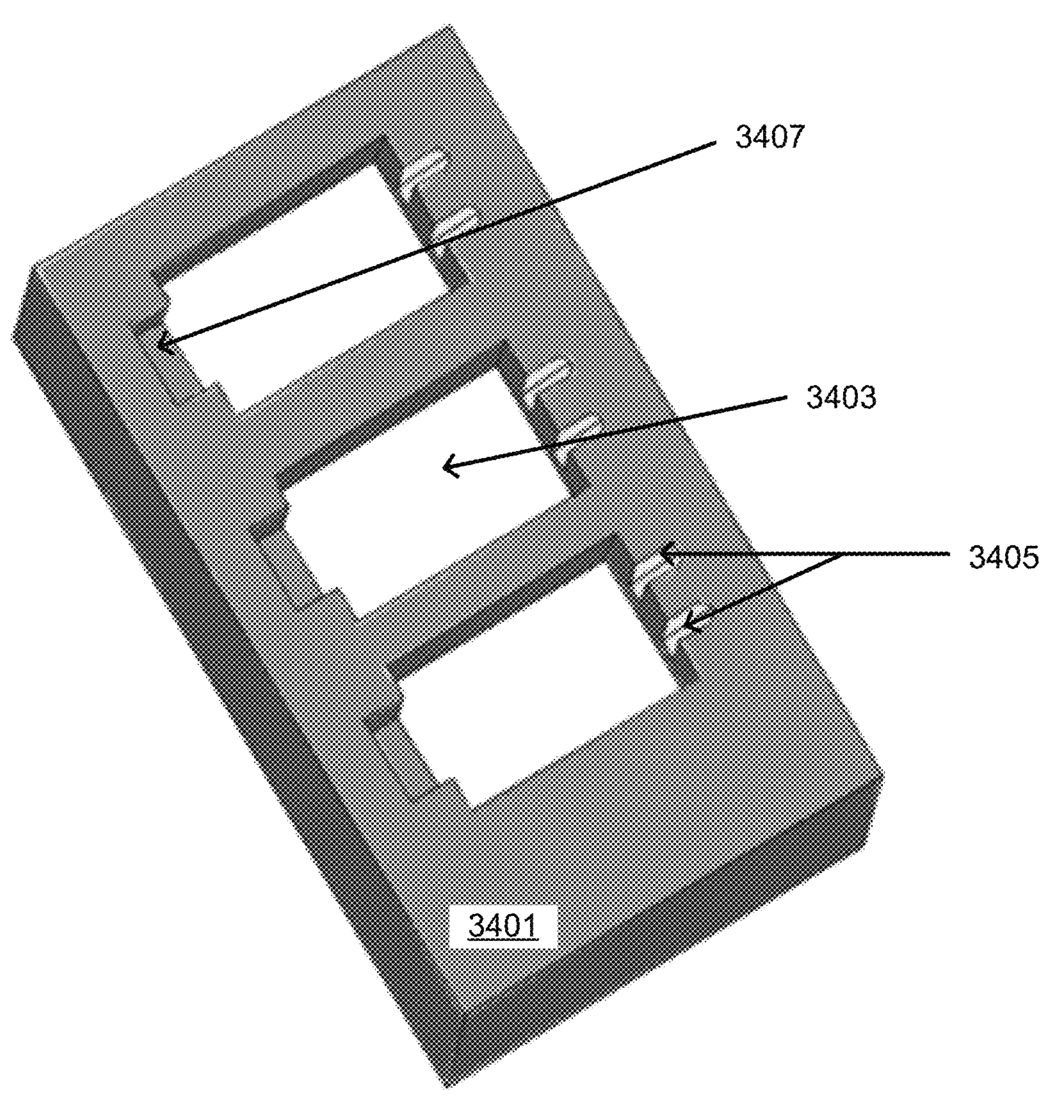
FIG. 34 illustrates one embodiment for a PCB with a modified capacitor mounting footprint to accommodate capacitors with radial pins and an insulator notch.

FIG. 34 illustrates one embodiment for a PCB with a modified capacitor mounting footprint to accommodate capacitors with radial pins and an insulator notch. The shown portion of PCB 3401 of FIG. 34 includes three PCB cuts, such as, for the mounting of E-caps or other surface mount devices with radial pins and opposing insulator notch. Each cut 3403 includes along one side plated half-through slots 3405 extending laterally from the opening 3403 for soldering the capacitor pins to the PCB. Extending laterally from the opposing side of the capacitor footprint opening 3403 is a non-plated half-through slot 3407 provided for giving a rest support for the capacitor's insulator notch. This helps to place and hold the capacitor during the assembly process.

Figure 35:
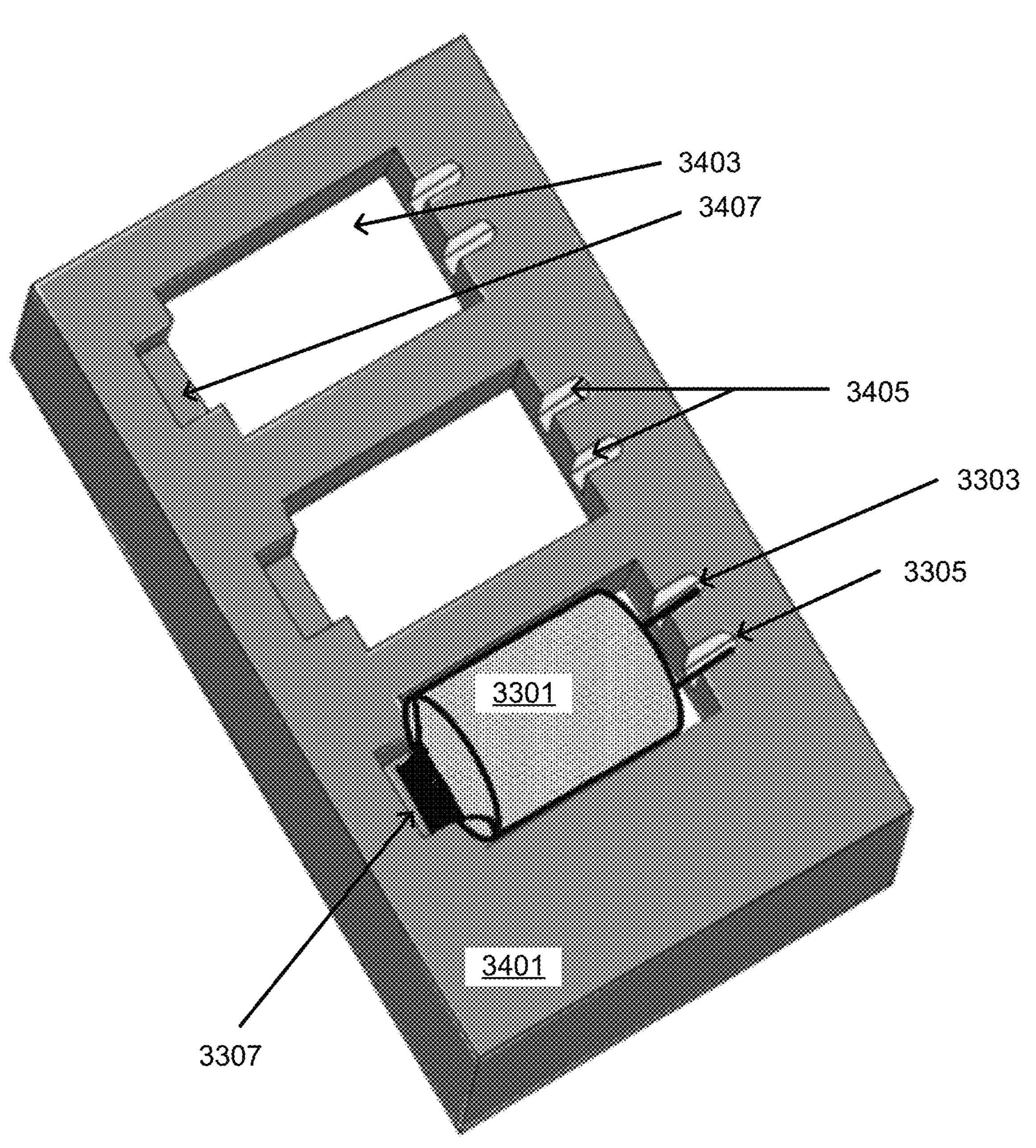
FIG. 35 illustrates a capacitor in the embodiment of FIG. 33A mounted into the portion of a PCB illustrated in FIG. 34.

FIG. 35 illustrates a capacitor in the embodiment of FIG. 33A mounted into the portion of a PCB illustrated in FIG. 34. More specifically, a capacitor 3301 is mounted into the lower-most cut 3403 of the PCB 3401. The capacitor pins 3303 and 3305 are resting in the half cuts 3405 with a conductive surface (e.g., copper plating) into which they can be soldered. The capacitor's insulator notch 3307 rests in the PCB's (non-conductive) half cut 3407 to provide support and stability.

Figure 36:
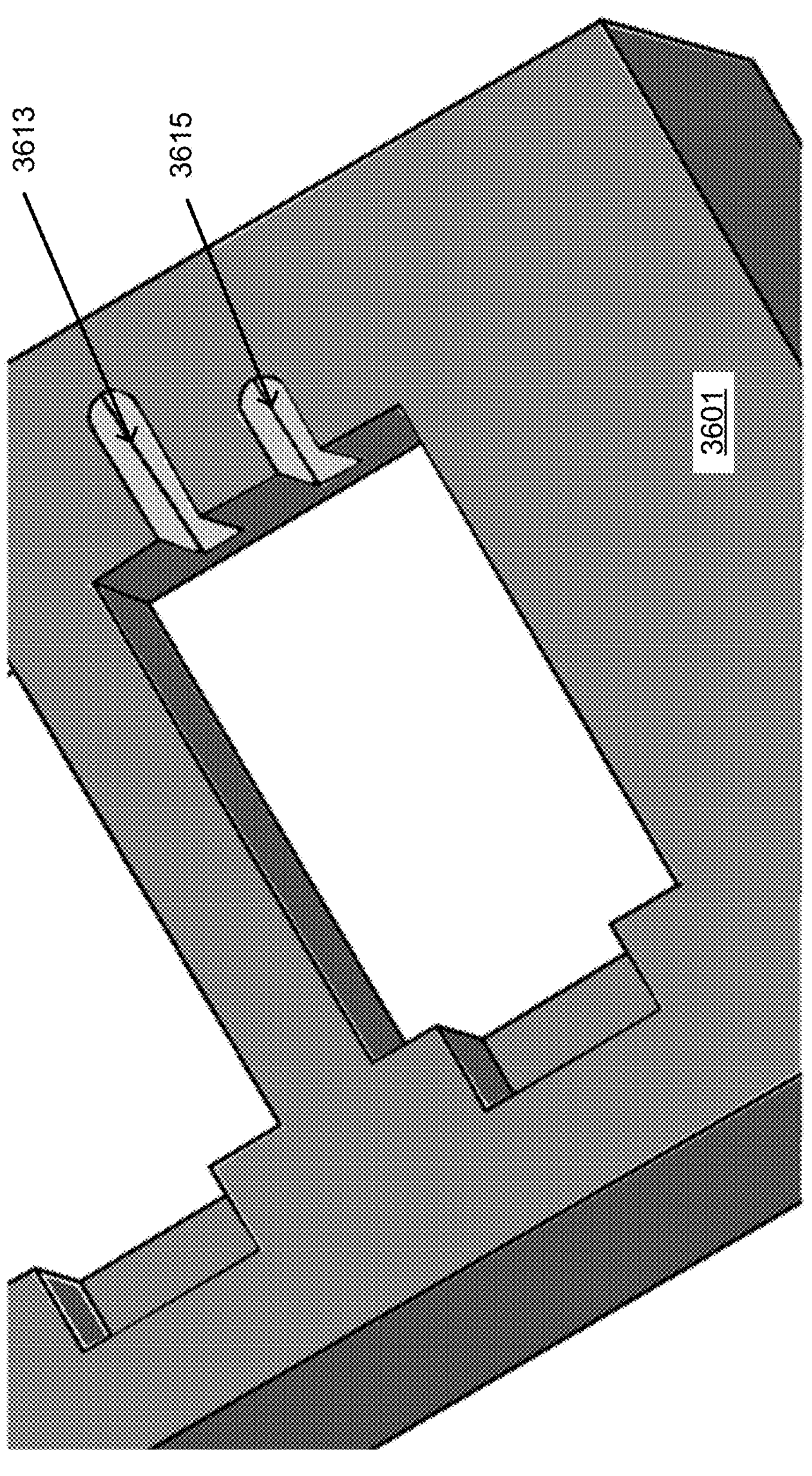
FIG. 36 illustrates an alternate embodiment for the half-cuts in the PCB for resting the capacitor pins to help avoid capacitor polarity reverse assembly.

FIG. 36 illustrates an alternate embodiment for the half-cuts in the PCB for resting the capacitor pins to help avoid capacitor polarity reverse assembly. If the capacitors or other device have a polarity to their pins, this arrangement can help to ensure that the device is installed into the PCB with the correct polarity. For example, referring back to the embodiment of FIG. 33B, the longer pin 3313 can correspond to the higher voltage input and the shorter pin 3315 can correspond to the lower voltage input. (Alternately, the assignment of polarities to the long and short pins can be reversed, but the following examples assign the longer pin to the positive, or higher, voltage.) FIG. 36 shows a portion of a PCB 3601 with one full cut out for the capacitor, similar to FIG. 35, but now, to help avoid capacitor polarity reverse assembly, the capacitor positive pin cut out 3613 is lengthier than the negative pin cut out 3615.

In the embodiments of FIGS. 34-36, because of the cut for capacitor on the PCB, the capacitor diameter be within the thickness of the PCH as well as having available both the top and the bottom clearance of the drive from the enclosure. There is no need for parameters changes for the electrolytic capacitors and no need for custom design, the only change being the formation of the notch. This will reduce the complexity of the capacitor modification.

As described with respect to FIGS. 33C and 33D, the insulator notch 3307/3317 can be formed from the extended insulating covering 3309. However, if there is an excess inventory of normal electrolytic capacitors or it is not possible to add an insulator notch during the process, an insulator notch can be added to the capacitor head side by gluing or setting insulator caps. This will be less expensive and complex than making separate PCB daughter board for electrolytic capacitors and connecting on to the drive.

Figure 37:
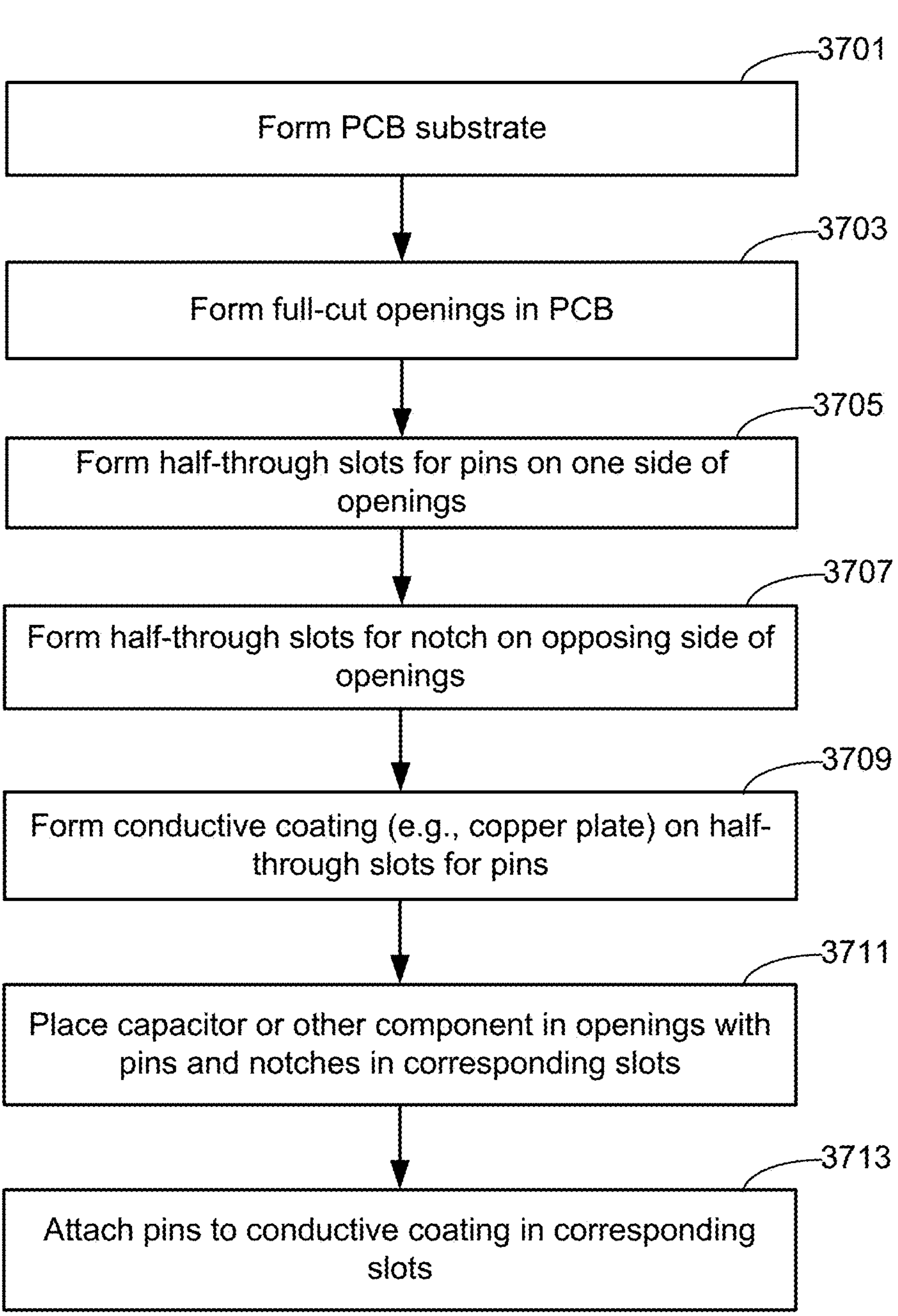
FIG. 37 is a flowchart for an embodiment of forming the structure of FIGS. 34-36.

FIG. 37 is a flowchart for an embodiment of forming the structure of FIGS. 34-36. Beginning at step 3701, the PCB substrate is formed, where this can be done as described above with respect to step 50 of FIG. 1, including the mounting of any memory chips or other semiconductors. At step 3703, the full-through openings or cuts 3403 are formed in the PCB 3401/3601, where, depending on the embodiment, the openings 3403 can be formed as part of the same process as step 3701 or formed into an already formed PCB. The half-through slots, such as 3405 or 3613, 3615, that will hold the devices' pins can be cut into one side of the full-through openings 3403. The examples here show a rectangular shape for the full-through openings 3403, but other shapes can be used to accommodate the shapes of the device to be mounted. In the embodiments of FIGS. 34 and 35, both of the pin slots are the same length, while in the embodiment of FIG. 36, they are different lengths to make it easier to mount the device with the correct polarity. Also, in the example embodiments shown herein, the half-cuts for the pins are all oriented along the same side of each of the openings 3403, but different orientations can be used for different openings based on how the circuitry on the PCB is laid out. Similarly, the size of the pin and notch half-cuts, as well as the number of pin half-cuts, can differ in size from opening to opening depending on the device to be mounted. At step 3707, the half-through notch rests 3407 are cut into the PCB. Steps 3705 and 3707 can be performed in either order or concurrently with each other and/or step 3703. Additionally, any or all of steps 3703, 3705, and 3707 can be incorporated into substrate formation at step 3701.

Once the half-through slots 3405 or 3613 and 3615 for the pins are formed at step 3705, a conductive coating is formed within them, such as by copper plating, at step 3709. At step 3711, the capacitors 3301/3311 or other devices are received and placed in the openings 3403, with their insulating notch 3307/3317 resting in the half-through cut 3407 and their pins 3303/3305 or 3313/3315 resting in the corresponding pin half-through cuts 3405 or 3613/3615. The receiving of the devices in step 3711 can also include their manufacture, as discussed above with respect to FIG. 33D. The pins are then attached electrically to their corresponding slots, such as by soldering, at step 3713.

High capacitance, hold-up capacitors are important in many applications, such as enterprise level SSDs. To store more energy, electrolytic capacitors or tantalum capacitors can be used on such drives. However, such devices typically have strict height constraints. Electrolytic capacitors are comparatively cheaper, but have a larger size (height and diameter) than tantalum capacitors. Because of this, it is very difficult to use the electrolytic capacitors in enterprise drives which have strict height constraints. By using the techniques presented above, the E-caps and other larger surface mount devices can be located within the PCB, helping to meet height restrictions. Consequently, this can reduce costs by using E-caps instead of the more expensive tantalum capacitors. This solution will support pick and place assembly procedures for the electrolytic capacitor, reducing the assembly complexity of electrolytic capacitor. As far as the capacitors themselves, no parameter changes are needed in the capacitor, aside from an extended outside insulator to form the notch. This will reduce capacitor modification difficulties.

One embodiment includes a semiconductor device, comprising: a printed circuit board (PCB) substrate; one or more semiconductor dies, and an electrical circuit device. The PCB comprises: a plurality of contact fingers configured to electrically couple the semiconductor device to a connector of a host device; a first opening fully through the substrate; one or more pin slots partially through a first surface of the substrate and extending laterally from a first side of the first opening, each of the pin slots lined with a conductive coating; and a notch slot partially through the first surface of the substrate and extending laterally from a side of the first opening opposing the first side of the first opening. The one or more semiconductor dies are mounted on the first surface of the substrate and electrically coupled to the contact fingers and to the conductive coating of one or more of the pin slots. The electrical circuit device is within the first opening and comprises: one or more pins extending from a first side of the electrical circuit device located in a corresponding one of the pin slots and electrically coupled to the conductive coating thereof; and a notch extending from a side of the electrical circuit device opposite the first side of the electrical circuit device located and resting in the notch slot.

Another embodiment includes a method, comprising: forming a printed circuit board (PCB) comprising multiple layers, including a plurality of conductive layers, and a plurality of contact fingers configured to electrically couple the conductive layers of the PCB to a connector of a host device; cutting one or more openings fully through the PCB; for each of the openings, cutting partially through the PCB to form one or more pin slots extending laterally from a first side of the opening; lining each of the one or more pin slots for each of the openings with a conductive coating, the conductive coating of each of the pin slots electrically coupled to one of the conductive layers; and for each of the openings, cutting partially through the PCB to form a notch slot extending laterally from a side of the opening opposing the first side of the opening.

One embodiment includes a method, comprising: forming an electrolytic capacitor having a body with a pair of pins extending radially from a first side thereof; covering the capacitor body with an insulating covering extending beyond the capacitor body from a side the capacitor body opposite the first side; and pressing the insulating covering extending beyond the capacitor body into a notch extending from the side opposite the first side.

For purposes of this document, reference in the specification to "an embodiment," "one embodiment," "some embodiments," or "another embodiment" may be used to describe different embodiments or the same embodiment. The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.15 mm, or alternatively, ±2.5% of a given dimension.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

We claim:

1. A semiconductor device, comprising:

a printed circuit board (PCB) substrate, comprising:

a plurality of contact fingers configured to electrically couple the semiconductor device to a host device;

a first opening fully through the substrate;

one or more pin slots partially through a first surface of the substrate and extending laterally from a first side of the first opening, each of the pin slots lined with a conductive coating;

a notch slot partially through the first surface of the substrate and extending laterally from a side of the first opening opposing the first side of the first opening;

one or more semiconductor dies mounted on the first surface of the substrate and electrically coupled to the contact fingers and to the conductive coating of one or more of the pin slots; and an electrical circuit device within the first opening, comprising:

one or more pins extending from a first side of the electrical circuit device located in a corresponding one of the pin slots and electrically coupled to the conductive coating thereof; and an insulator notch extending outward from a side of the electrical circuit device opposite the first side of the electrical circuit device located and resting in the notch slot.

2. The semiconductor device of claim 1, wherein the pin slots lined with the conductive coating are copper plated.

3. The semiconductor device of claim 1, wherein the electrical circuit device is covered with an insulating covering extending beyond a body of the electrical circuit device from the side of the electrical circuit device opposite the first side of the electrical circuit device and pressed into the notch.

4. The semiconductor device of claim 1, wherein the one or more pin slots are two pin slots, both extending a same distance laterally from the first side of the first opening.

5. The semiconductor device of claim 1, wherein the one or more pin slots are two pin slots, extending difference distances laterally from the first side of the first opening.

6. The semiconductor device of claim 1, wherein the electrical circuit device is an electrolytic capacitor.

7. The semiconductor device of claim 1, wherein one or more pins are soldered to the conductive coating of the corresponding pin slot.

8. The semiconductor device of claim 1, wherein the one or more semiconductor dies include one or more memory dies and a memory controller die.

9. The semiconductor device of claim 1, wherein the electrical circuit device is an inductor.

10. The semiconductor device of claim 1, wherein the electrical circuit device is a resistor.

11. The semiconductor device of claim 1, wherein the one or more semiconductor dies include a stack of a plurality of memory dies.

12. The semiconductor device of claim 8, wherein the semiconductor device is a solid state drive (SSD).

13. The semiconductor device of claim 11, wherein each of the memory dies comprise a NAND memory array having a 3D architecture.

14. The semiconductor device of claim 11, wherein the one or more semiconductor dies further includes a memory controller die.

* * * * *